(12) United States Patent
Sarpatwari et al.

(10) Patent No.: US 11,710,528 B2
(45) Date of Patent: Jul. 25, 2023

(54) DATA-BASED POLARITY WRITE OPERATIONS

(71) Applicant: Micron Technology, Inc., Boise, ID (US)

(72) Inventors: Karthik Sarpatwari, Boise, ID (US); Nevil N. Gajera, Meridian, ID (US); Hongmei Wang, Boise, ID (US); Mingdong Cui, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 15 days.

(21) Appl. No.: 17/487,792

(22) Filed: Sep. 28, 2021

(65) Prior Publication Data

US 2022/0093190 A1 Mar. 24, 2022

Related U.S. Application Data

(63) Continuation of application No. 16/929,884, filed on Jul. 15, 2020, now Pat. No. 11,139,034.

(51) Int. Cl.
*G11C 7/00* (2006.01)
*G11C 16/34* (2006.01)
(Continued)

(52) U.S. Cl.
CPC .......... *G11C 16/3404* (2013.01); *G11C 16/10* (2013.01); *G11C 16/26* (2013.01); *G11C 16/30* (2013.01)

(58) Field of Classification Search
CPC ....... G11C 7/1078; G11C 7/22; G11C 7/1006; G11C 7/1072; G11C 7/1096
(Continued)

(56) References Cited

U.S. PATENT DOCUMENTS 9,552,879 B2 1/2017 Lee et al.
2012/0069633 A1* 3/2012 Katoh ................ G11C 13/004
365/148
(Continued)

FOREIGN PATENT DOCUMENTS

CN 105869671 A 8/2016
TW 201640355 A 11/2016

OTHER PUBLICATIONS

ISA/KR, International Search Report and Written Opinion of the International Searching Authority, Int'l Appl. No. PCT/US2021/040552, Oct. 26, 2021, Korean Intellectual Property Office, Seo-gu, Daejeon, Republic of Korea, 9pgs.

(Continued)

*Primary Examiner* — Son T Dinh
(74) *Attorney, Agent, or Firm* — Holland & Hart LLP

(57) ABSTRACT

Methods, systems, and devices for data-based polarity write operations are described. A write command may cause a set of data to be written to a set of memory cells. To write the set of data, a write operation that applies voltages across the memory cells based on a logic state of data to be written to the memory cells may be used. During a first interval of the write operation, a voltage may be applied across a memory cell based on a logic state of a data bit to be written to the memory cell. During a second interval of the write operation, a voltage may be applied across the memory cell based on an amount of charge conducted by the memory cell during the first interval.

20 Claims, 10 Drawing Sheets

(51) Int. Cl.
*G11C 16/30* (2006.01)
*G11C 16/26* (2006.01)
*G11C 16/10* (2006.01)

(58) Field of Classification Search
USPC .......................... 365/189.16, 189.14, 185.22
See application file for complete search history.

(56) References Cited

U.S. PATENT DOCUMENTS

| | | |
|---|---|---|
| 2014/0301132 A1 | 10/2014 | Adachi et al. |
| 2016/0027508 A1 | 1/2016 | Lee et al. |
| 2016/0104530 A1 | 4/2016 | Calderoni et al. |
| 2016/0111150 A1 | 4/2016 | Bazarsky et al. |
| 2018/0102157 A1 | 4/2018 | Bedeschi et al. |
| 2019/0295636 A1 | 9/2019 | Tortorelli et al. |

OTHER PUBLICATIONS

Taiwan Patent Office, "Office Action," issued in connection with Taiwan Patent Application No. 110123283 dated Jan. 13, 2022 (6 pages).

\* cited by examiner

DATA-BASED POLARITY WRITE OPERATIONS

CROSS REFERENCE

The present Application for Patent is a continuation of U.S. patent application Ser. No. 16/929,884 by Sarpatwari et al., entitled "DATA-BASED POLARITY WRITE OPERATIONS," filed Jul. 15, 2020, which is assigned to the assignee hereof, and expressly incorporated by reference in its entirety herein.

BACKGROUND

The following relates generally to one or more memory systems and more specifically to data-based polarity write operations.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
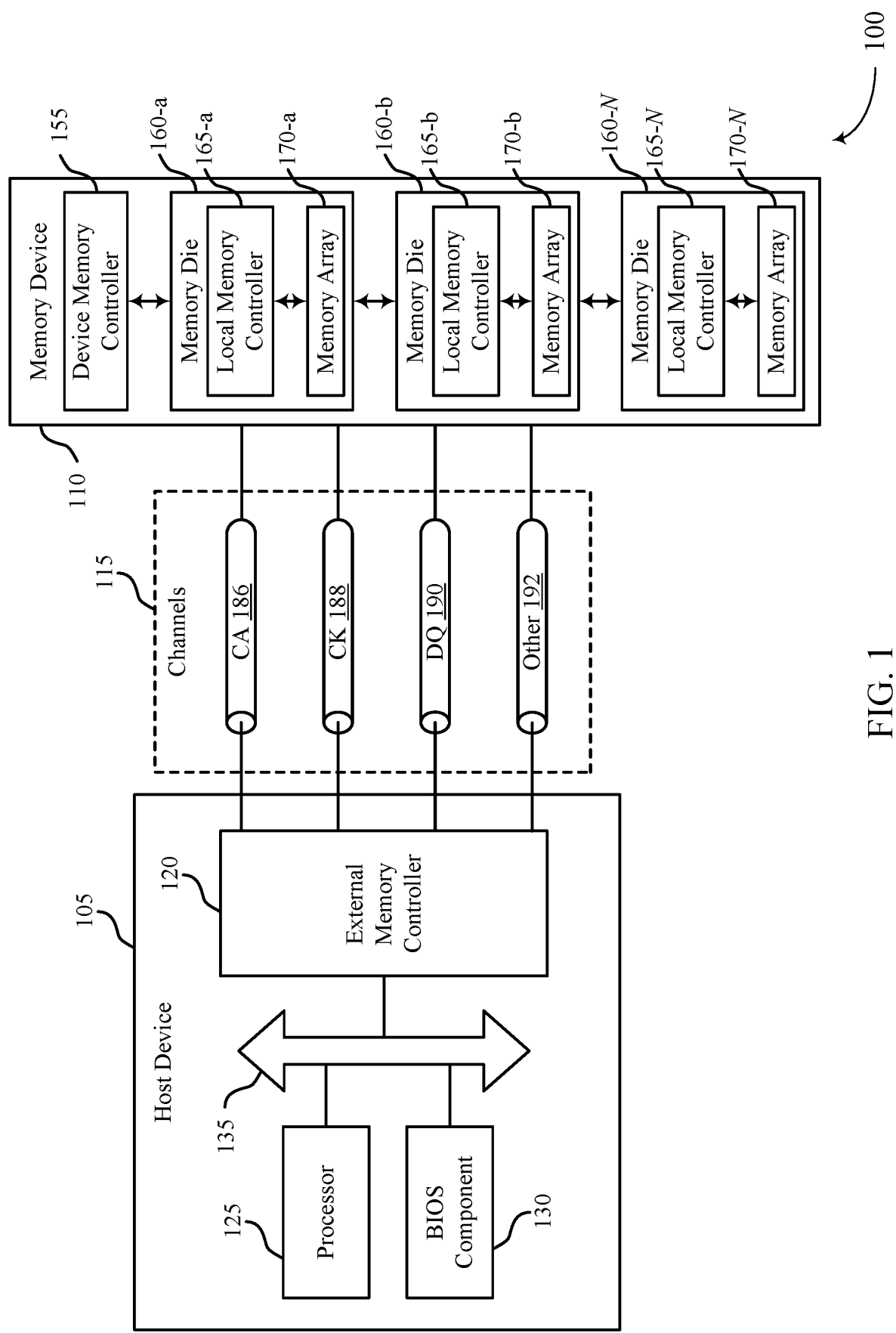
FIG. 1 illustrates an example of a system that supports data-based polarity write operations in accordance with examples as disclosed herein.

An operation for writing a logic value to a memory cell may include a programming operation. During the programming operation, either a negative or positive programming voltage may be applied to the memory cell based on a logic value of a data bit to be written to the memory cell. A writing operation that selects a polarity of a programming voltage based on incoming data without consideration of data already stored in the memory cell may be referred to as a "force write" operation.

An alternative operation for writing a logic value (e.g., a SET or RESET state) to a memory cell may include a pre-read operation and a programming operation. During the pre-read operation, a negative pre-read voltage may be applied across a memory cell to determine a logic value stored by the memory cell (e.g., independently of a logic value of a data bit to be written to the memory cell). During the programming operation, a negative, neutral, or positive programming voltage may be applied across the memory cell to write a logic value to the memory cell based on the logic value stored by the memory cell and the logic value to be written to the memory cell. A magnitude of the negative and positive programming voltages may be greater than a magnitude of the negative pre-read voltage. A writing operation that always applies a negative pre-read voltage may be referred to as a "default write" operation. The "default write" operation may reduce stress on the memory cells by reducing the quantity of high-magnitude programming pulses applied to the cells (e.g., by not applying the larger negative programming voltage if the cell is determined to already store a SET state). But, for cells that currently store a SET state and are being programmed to a RESET state, the "default write" may use more power than the "force write" (e.g., transitioning from the negative pre-read voltage to the positive programming voltage may use more energy than transitioning from a neutral voltage to the positive programming voltage).

According to aspects described herein, an enhanced writing operation that is based on incoming data may be used. In some examples, a pre-read operation of a writing operation initiated for a memory cell may use a pre-read voltage that is based on a logic value of an incoming data bit. For example, if the incoming data bit is associated with a SET state, the pre-read voltage may be a negative pre-read voltage. Otherwise, if the incoming data bit is associated with a RESET state, the pre-read voltage may be a positive pre-read voltage. A writing operation that selects a pre-read polarity based on incoming data may be referred to as a "polarity write" operation.

By selecting a polarity of a pre-read voltage applied to a memory cell based on a logic value of an incoming data bit to be written to the memory cell, an average magnitude of a transition from a pre-read voltage to a programming voltage may be reduced, conserving energy. That is, transitions from a negative pre-read voltage to a positive programming voltage may be replaced with smaller transitions from a positive pre-read voltage to a positive programming voltage. Also, by selecting a polarity of a pre-read voltage applied to a memory cell based on a logic value of an incoming data bit to be written to the memory cell, a state of the memory cell may be conserved when a logic value to be written to the memory cell matches the logic value stored by the memory cell—that is, a programming operation for the memory cell may be skipped, saving energy and conserving the state of the memory cell.

The polarity write operation may be used in combination with the default write operation and/or the force write operation. In some examples, a memory device that receives multiple write commands may perform polarity write operations for a first subset of the write commands and force write operations for a second subset of the write operations. The memory device may further perform default write operations for a third subset of the write commands. In some cases, the memory device may determine whether to perform a polarity write operation, a default write operation, or a force write operation for a memory cell based on an amount of drift associated with the memory cell.

Features of the disclosure are initially described in the context of memory systems and dies as described with reference to FIGS. 1 and 2. Features of the disclosure are described in the context of a block diagram, timing diagrams, and a distribution diagram as described with reference to FIGS. 3 through 7. These and other features of the disclosure are further illustrated by and described with reference to an apparatus diagram and flowcharts that relate to data-based polarity write operations as described with references to FIGS. 8 through 11.

FIG. 1 illustrates an example of a system that supports data-based polarity write operations in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include an I/O controller. An I/O controller may manage data communication between the processor 125 and the peripheral component(s), input devices, or output devices. The I/O controller may manage peripherals that are not integrated into or with the system 100 or the host device 105. In some examples, the I/O controller may represent a physical connection or port to external peripheral components.

In some examples, the system 100 or the host device 105 may include an input component, an output component, or both. An input component may represent a device or signal external to the system 100 that provides information, signals, or data to the system 100 or its components. In some examples, and input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a row line or column line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, the CA channel 186 may include a read command with an address of the desired data. In some examples, a CA channel 186 may include any number of signal paths to decode one or more of address or command data (e.g., eight or nine signal paths).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be x4 (e.g., including four signal paths), x8 (e.g., including eight signal paths), x16 (including sixteen signal paths), etc.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

To conserve energy, a memory controller (e.g., an external memory controller 120, a device memory controller 155, or a local memory controller 165) may use an enhanced writing operation that is based on incoming data. In some examples, the memory controller may use a pre-read voltage that is based on a logic value of an incoming data bit during a pre-read operation of a write operation initiated for a memory cell. For example, if the incoming data bit is associated with a SET state, the pre-read voltage may be a negative pre-read voltage. Otherwise, if the incoming data bit is associated with a RESET state, the pre-read voltage may be a positive pre-read voltage. A writing operation that selects a pre-read polarity based on incoming data may be referred to as a polarity write operation.

By selecting a polarity of a pre-read voltage applied to a memory cell based on a logic value of an incoming data bit to be written to the memory cell, an average magnitude of a transition from a pre-read voltage to a programming voltage may be reduced, conserving energy. That is, transitions from a negative pre-read voltage to a positive programming voltage may be replaced with smaller transitions from a positive pre-read voltage to a positive programming voltage. Also, by selecting a polarity of a pre-read voltage applied to a memory cell based on a logic value of an incoming data bit to be written to the memory cell, a state of a memory cell may be conserved when a logic value to be written to the memory cell matches the logic value stored by the memory cell.

The polarity write operation may be used in combination with a default write operation and/or a force write operation. In some examples, a memory controller that receives multiple write commands may perform polarity write operations for a first subset of the write commands and force write operations for a second subset of the write operations. The memory controller may further perform default write operations for a third subset of the write commands. In some cases, the memory controller may determine whether to perform a polarity write operation, a default write operation, or a force write operation for a memory cell based on an amount of drift associated with the memory cell.

Figure 2:
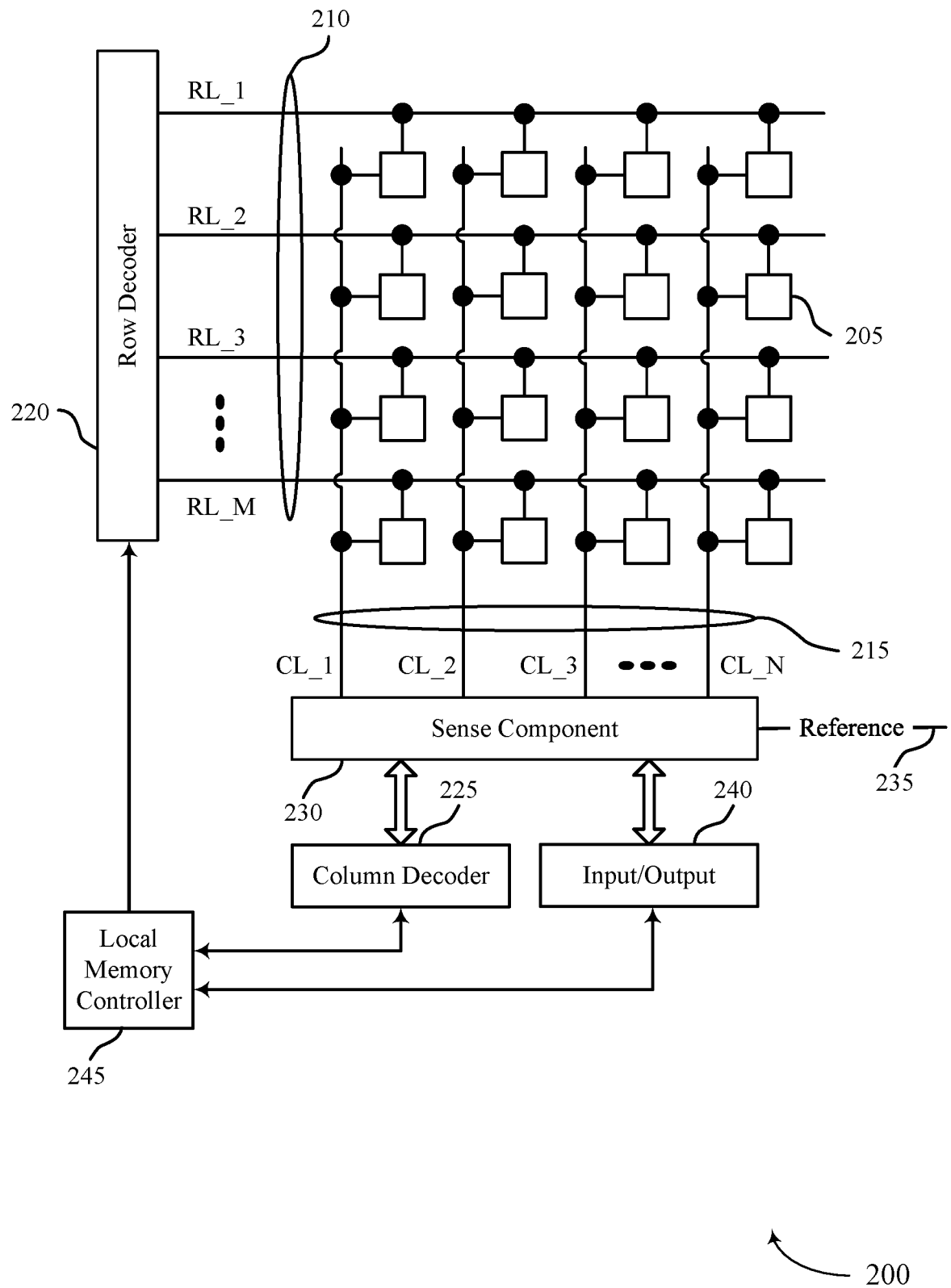
FIG. 2 illustrates an example of a memory die that supports data-based polarity write operations in accordance with examples as disclosed herein.

FIG. 2 illustrates an example of a memory die that supports data-based polarity write operations in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component. For example, a chalcogenide storage element may be used in a phase change memory (PCM) cell, a thresholding memory cell, or a self-selecting memory cell. A logic state may be written to the memory cell 205 with an access operation.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 260 and activate a row line 210 based on the received row address. A column decoder 225 may receive a column address from the local memory controller 260 and may activate a column line 215 based on the received column address. The access operation may be a read operation or a write operation. In some cases, there may be more than one type of write operation. For example, the write operation may be a polarity write operation, a default write operation, or a force write operation. For each type of write operation, the voltage polarity and magnitude may vary.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200. In some examples, the sense component 230 may be configured in a bi-polarity configuration. That is, the sense component 230 may be coupled with the row lines 210 and the column lines 215. In such cases, the sense component 230 may be configured to sense logic states stored by a memory cell 205 from either the row lines 210 or the column lines 215.

The local memory controller 260 may control the accessing of memory cells 205 through the various components (e.g., row decoder 220, column decoder 225, sense component 230). The local memory controller 260 may be an example of the local memory controller 165 described with reference to FIG. 1. In some examples, one or more of the row decoder 220, column decoder 225, and sense component 230 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target row line 210 and the target column line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target row line 210 and a target column line 215 coupled with the target memory cell 205 (e.g., the address of the target memory cell 205). The local memory controller 260 may activate the target row line 210 and the target column line 215 (e.g., applying a voltage to the row line 210 or column line 215) to access the target memory cell 205. The local memory controller 260 may apply a specific signal (e.g., write pulse) to the column line 215 during the write operation to store a specific state in the storage element of the memory cell 205. The pulse used as part of the write operation may include one or more voltage levels over a duration.

In some cases, the write operation for a memory cell may include a single programming operation. During the programming operation, a single negative or positive programming voltage may be applied across a memory cell based on a logic value of a data bit to be written to the memory cell. For example, if a SET state is to be written to the memory cell, the local memory controller 260 may apply a negative programming voltage across the memory cell. In some cases, the negative programming voltage may be equal to or greater than a negative programming voltage applied during a default write operation. Otherwise, if a RESET state is to be written to the memory cell, the local memory controller 260 may apply a positive programming voltage across the memory cell. In some cases, the positive programming voltage may be equal to or greater than a positive programming voltage applied during a default write operation. A write operation that does not include a pre-read operation may be referred to as a force write operation. In some cases, a force write operation is used to compensate for voltage threshold drift that may occur for a memory cell—e.g., based on not being accessed for a duration or based on an operating life of the memory cell.

In other cases, the write operation may include multiple operations. For example, the write operation may include a pre-read operation that is used to determine whether a targeted memory cell is currently storing a SET or RESET state. During the pre-read operation, the local memory controller 260 may apply a negative pre-read voltage across the targeted memory cell regardless of a logic value of a data bit to be written to the memory cell. A magnitude of the negative pre-read voltage may be between a threshold voltage for a memory cell storing a SET state and a threshold voltage of a memory cell storing a RESET state. The voltage level of the pre-read voltage may also be referred to as a demarcation voltage. While the negative pre-read voltage is applied across the targeted memory cell, the local memory controller 260 may monitor an amount of current that flows through the local memory controller 260. If the current flowing through the local memory controller 260 exceeds a threshold (which may also be referred to as a "snap" event), the local memory controller 260 may determine that the memory cell is storing a particular logic value (e.g., a SET state). Otherwise, the local memory controller 260 may determine that the memory cell is either storing a RESET state or that the memory cell is storing a SET state, but the threshold voltage of the memory cell has drifted below the negative pre-read voltage.

After performing the pre-read operation, the local memory controller 260 may perform a programming operation to complete the write operation based on a result of the pre-read operation and a state of a data bit to be written to the memory cell. For example, if the local memory controller 260 detects a snap event and a SET state is to be written to the memory cell, the local memory controller 260 may determine the memory cell is already storing a SET state and remove the pre-read voltage applied across the memory cell (which may also be referred to as applying a neutral programming voltage across the memory cell) during the programming operation. Thus, the memory cell may maintain the SET state (e.g., or be "read-refreshed") by the write operation. In some cases, the memory cell may be referred to as being read-refreshed based on the write operation resetting a threshold voltage of the memory cell to a baseline (non-drifted) level. In another example, if the local memory controller 260 detects a snap event and a RESET state is to be written to the memory cell, the local memory controller 260 may determine the memory cell is currently storing a SET state and may apply a positive programming voltage across the memory cell during the programming operation. Based on applying the positive programming voltage across the memory cell storing the SET state, the memory cell may be written to the RESET state.

In yet another example, if the local memory controller 260 fails to detect the snap event, the local memory controller 260 may apply a modified programming voltage across the memory cell during the programming operation based on the state of a data bit to be written to the memory cell. For example, if a SET state is to be written to the memory cell, the local memory controller 260 may apply a larger negative programming voltage across the memory cell. Otherwise, if a RESET state is to be written to the memory cell, the local memory controller 260 may apply a positive programming voltage across the memory cell, where a magnitude of the positive programming voltage may be greater than a magnitude of the negative pre-read voltage and/or equivalent to a magnitude of the negative programming voltage. Thus, the local memory controller 260 may always transition from the negative pre-read voltage to the positive programming voltage, if a RESET state is to be written to the memory cell. A writing operation that always applies a negative pre-read voltage may be referred to as a "default write" operation.

Transitioning from the negative pre-read voltage to a negative or a positive programming voltage may consume energy. In either case, the amount of energy consumed by the transition may be determined based on the equation $\sim(0.5*C_{tot}*(V_{PGM}-V_{RD})V_{PGM})$, where $C_{tot}$ represents an amount of capacitance associated with accessing the memory cell; $V_{PGM}$ represents the programming voltage, and $V_{RD}$ represents the pre-read voltage. Thus, transitioning from the negative pre-read voltage to the positive programming voltage may consume additional energy relative to transitioning from the negative pre-read voltage to the negative programming voltage—e.g., because the value of $V_{PGM}-V_{RD}$ may be greater. Also, in some cases, additional power may be consumed during a writing operation when a RESET state is to be written to a memory cell storing a SET state based on a first snap event occurring during the pre-read operation followed by the transition to a positive programming voltage for the programming operation (and a second snap event may occur). Thus, the "default write" operation may use more power than the "force write" operation for some memory cells, and may not conserve substantial power over the "force write" operation for each write operation.

To conserve energy, the local memory controller 260 may use an enhanced writing operation that is based on incoming data. In some examples, the local memory controller 260 may use a pre-read voltage that is based on a logic value of an incoming data bit during a pre-read operation of a write operation initiated for a memory cell. For example, if the incoming data bit is associated with a SET state, the pre-read voltage may be a negative pre-read voltage. Otherwise, if the incoming data bit is associated with a RESET state, the pre-read voltage may be a positive pre-read voltage. A write operation that selects a pre-read polarity based on incoming data may be referred to as a polarity write operation.

By selecting a polarity of a pre-read voltage applied to a memory cell based on a logic value of an incoming data bit to be written to the memory cell, an average magnitude of a transition from a pre-read voltage to a programming voltage may be reduced, conserving energy. That is, transitions from a negative pre-read voltage to a positive programming voltage may be replaced with smaller transitions from a positive pre-read voltage to a positive programming voltage. Also, by selecting a polarity of a pre-read voltage applied to a memory cell based on a logic value of an incoming data bit to be written to the memory cell, a state of the memory cell may be conserved when a logic value to be written to the memory cell matches the logic value stored by the memory cell.

The polarity write operation may be used in combination with a default write operation and/or a force write operation. In some examples, a local memory controller 260 that receives multiple write commands may perform polarity write operations for a first subset of the write commands and force write operations for a second subset of the write operations. The local memory controller 260 may further perform default write operations for a third subset of the write commands. In some cases, the local memory controller 260 may determine whether to perform a polarity write operation, a default write operation, or a force write operation for a memory cell based on an amount of drift associated with the memory cell.

Figure 3:
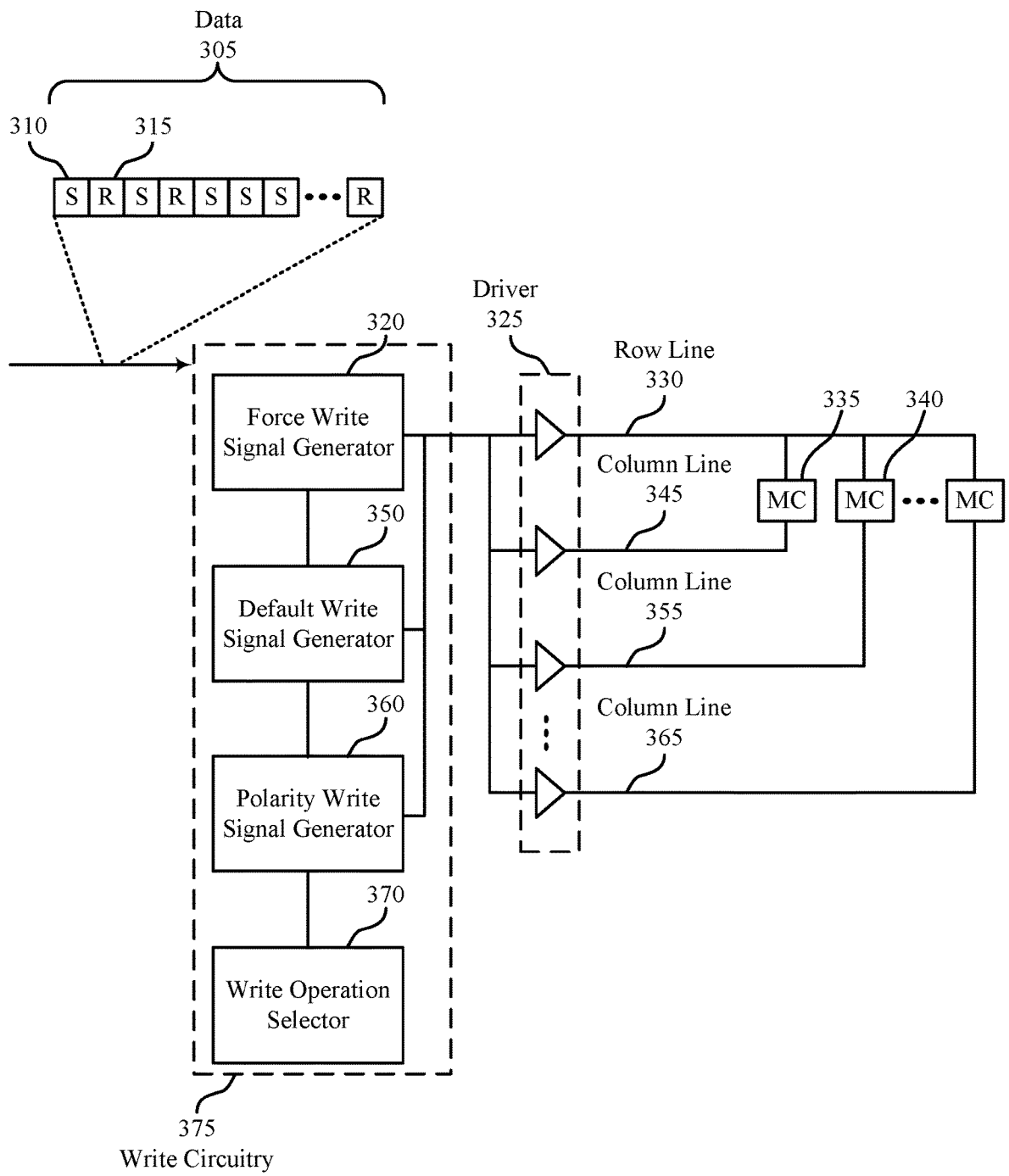
FIG. 3 illustrates an example of a block diagram that supports data-based polarity write operations in accordance with examples as disclosed herein.

FIG. 3 illustrates a block diagram of memory device that supports data-based polarity write operations in accordance with examples as disclosed herein.

Memory device 300 may include write circuitry 375, force write signal generator 320, default write signal generator 350, polarity write signal generator 360, write operation selector 370, driver 325, and a memory array that includes memory cells, such as first memory cell 335 and second memory cell 340. The memory cells represented in FIG. 3 may be examples of a set of memory cells as described with reference to FIG. 2. The memory cells may be coupled with a common row line (e.g., row line 330) and respective column lines, such as first column line 345 through nth column line 365.

Write circuitry 375 may be configured to receive data to be written to a memory array. Write circuitry 375 may also be configured to write the received data to the memory array. A set of data received by write circuitry 375 may include a set of bits, where each bit may represent a logic state (e.g., either a SET state or a RESET state). Each bit may also be associated with a particular memory cell within the memory array.

Polarity write signal generator 360 may be configured to perform a write operation for a memory cell that includes a first interval during which a pre-read voltage is applied and a second interval during which a programming voltage may be applied. The polarity write signal generator may be further configured to determine a polarity for the pre-read voltage based on a logic state represented by a bit that is to be written to a memory cell. Polarity write signal generator 360 may include a component that determines a logic state of a bit before polarity write signal generator 360 generates signals for writing to a set of memory cells. Polarity write signal generator 360 may be configured to generate separate signals for accessing different memory cells—e.g., based on respective incoming data bit and/or a logic state of a memory cell sensed during a pre-read operation.

Default write signal generator 350 may be configured to perform a write operation for a memory cell that includes a first interval during which a pre-read voltage is applied and a second interval during which a programming voltage may be applied. The default write signal generator may apply the pre-read voltage with a first polarity (e.g., a negative polarity) regardless of the logic state represented by a bit that is to be written to the memory cell. Default write signal generator 350 may be configured to generate separate signals for accessing different memory cells—e.g., based on a logic state of a memory cell sensed during a pre-read operation.

Force write signal generator 320 may be configured to perform a write operation for a memory cell that includes applying a relatively large programming voltage throughout the write operation. The voltage may be selected to be large enough to cause any memory cell in the memory array to conduct charge (e.g., large enough to satisfy snap conditions for all (or almost all) of the memory cells in the memory array).

Write operation selector 370 may select one of force write signal generator 320, default write signal generator 350, or polarity write signal generator 360 for a write operation for a memory cell. Write operation selector 370 may select the signal generator based on an amount of drift associated with a memory cell.

Driver 325 may be configured to receive one or more signals from force write signal generator 320, default write signal generator 350, and polarity write signal generator 360. In some cases, the signals may be selected by write operation selector 370. Driver 325 may be used to independently access memory cells, such as first memory cell 335 or second memory cell 340, for the write operation. For example, driver 325 may activate row line 330 and first column line 345 to access first memory cell 335 and may activate row line 330 or second column line 355 to access second memory cell 340. Driver 325 may send one or more voltages across the access lines to the memory cell according to the one or more signals. The voltages may correspond to different portions of a write operation.

In some cases, memory device 300 may receive data 305 including a set of bits. Each bit may represent a logic state. For example, first bit 310 may represent a SET state and second bit 315 may represent a RESET state. First bit 310 and second bit 315 may be written to respective memory cells according to a write operation. For example, first bit 310 may be written to first memory cell 335 and second bit 315 may be written to second memory cell 340 using one of the types of write operations. Different sets of data 305 may be written using different types of write operations. For example, a force write operation may be used to write a first set of data 305 and a polarity write operation may be used to write a second set of data 305. In some cases, the bits of a given set of data 305 may be written to the memory cells using different types of write operations, such as when different columns of memory cells experience different drift conditions.

In some cases, a polarity write operation may be used to write data 305 to the memory array. Before generating signals for driver 325, polarity write signal generator 360 may determine a state of each bit of data 305. For example, polarity write signal generator 360 may determine that first bit 310 is associated with a SET state, that second bit 315 is associated with a RESET state, and so on. Polarity write signal generator 360 may also determine that first bit 310 is to be written to first memory cell 335, that second bit 315 is to be written to second memory cell 340, and so on. After a state of the incoming data bits and the corresponding memory cells are identified, polarity write signal generator 360 may generate a set of signals for writing the bits to the memory cells. In some examples, polarity write signal generator 360 generates a first set of pre-read signals that cause a negative voltage to be applied across first memory cell 335 based on first bit 310 having a SET state concurrently with a second set of pre-read signals that cause a positive voltage to be applied across second memory cell 340 based on second bit 315 having a RESET state. Polarity write signal generator 360 may generate additional sets of pre-read signals that are applied across additional memory cells. Polarity write signal generator 360 may also generate sets of programming signals based on a result of the pre-read operation.

Driver 325 may receive the signals from polarity write signal generator 360. Driver 325 may use row line 330 and first column line 345 to perform a polarity write operation on first memory cell 335 corresponding to a bit of data 305. For example, driver 325 may apply one or more voltages across first memory cell 335 during a pre-read portion of the polarity write operation and a programming portion of the polarity write operation. In some cases, the polarity of the one or more voltages applied across the memory cells may be based on the state of the bit (e.g., if the bit represents a SET or RESET state). For example, to write the SET state represented by first bit 310, a polarity of the voltage applied across first memory cell 335 during the pre-read portion of the write operation may be different than a polarity of the voltage applied across second memory cell 340 during the pre-read portion of the write operation to write the RESET state represented by second bit 315. The signals generated by polarity write signal generator 360 and the corresponding voltages applied across memory cell are described in more detail herein and with reference to FIGS. 4A through 4D.

In some cases, write operation selector 370 may determine which type of write operation (e.g., a force write operation, a default write operation, or a polarity write operation) to use to write data 305 (or individual bits of data 305) to a memory array. For example, each bit of data 305 may be input to one of force write signal generator 320, default write signal generator 350, or polarity write signal generator 360 depending on the type of write operation selected by write operation selector 370 for data 305. In other examples, individual bits of data 305 may be input to a respective one of force write signal generator 320, default write signal generator 350, or polarity write signal generator 360 depending on the type of write operation selected by write operation selector 370 for a respective bit. In some examples, write operation selector 370 may select a type of write operation for writing to a memory cell based on memory-based criteria—e.g., the amount of drift (e.g., a threshold voltage drift) associated with a memory cell (or set of memory cells), the operating life of a memory cell (or set of memory cells), or any combination thereof. Thus, force write signal generator 320, default write signal generator 350, polarity write signal generator 360, or a combination thereof may send one or more generated signals to driver 325.

FIGS. 4A through 4D illustrate examples of timing diagrams that support data-based polarity write operations in accordance with examples as disclosed herein. Timing diagrams 400 may illustrate voltages applied across a memory cell in a memory array over time during different polarity write operations. For example, timing diagram 400-a and timing diagram 400-b may illustrate polarity write operations for writing a bit having a SET state (e.g., first bit 310 of FIG. 3), while timing diagram 400-c and timing diagram 400-d may illustrate polarity write operations for writing a bit having a RESET state (e.g., second bit 315 of FIG. 3).

In some cases, as shown in timing diagram 400-a and timing diagram 400-c, a voltage applied across a memory cell during a pre-read portion of a polarity write operation may satisfy a threshold associated with a snap condition in which the memory cell conducts charge. In other cases, as shown in timing diagram 400-b and timing diagram 400-d, a voltage applied across a memory cell during a pre-read portion of a polarity write operation may not satisfy a snap condition for the memory cell. Whether the snap condition is met may determine the magnitude of a voltage applied to the memory cell during a programming portion of the polarity write operation.

Figure 4A:
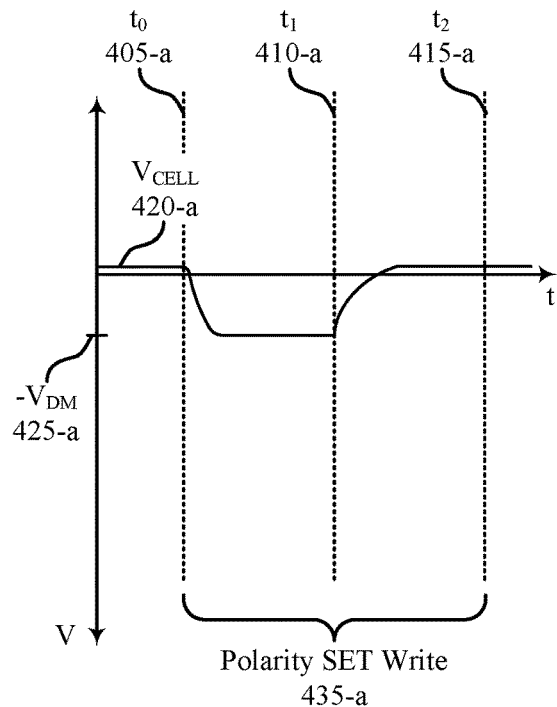
FIGS. 4A through 4D illustrate examples of timing diagrams that support data-based polarity write operations in accordance with examples as disclosed herein.

As illustrated in FIG. 4A, a memory device may receive a set of data (e.g., data 305 of FIG. 3) including a bit (e.g., first bit 310) that is to be written to a memory cell (e.g., first memory cell 335 of FIG. 3). After receiving the data, the memory device may determine a state represented by the bit and a polarity for a pre-read voltage based on the state represented by the bit. For example, the memory device may determine that a SET state is represented by the bit, and thus, that a negative voltage is to be applied across the memory cell during a pre-read operation of polarity SET write operation 435-a. After determining the polarity of the pre-read voltage, the memory device may perform polarity SET write operation 435-a for the memory cell. A voltage applied across the memory cell during polarity SET write operation 435-a may be represented as cell voltage 420-a (which may also be referred to as $V_{CELL}$). Prior to performing polarity SET write operation 435-a, the memory cell may have an initial voltage (e.g., 0V or virtual ground).

At first time 405-a (which may also be referred to as to), the memory device may initiate polarity SET write operation 435-a by applying first demarcation voltage 425-a (which may also be referred to as $V_{DM}$) with a negative polarity. The memory device may apply first demarcation voltage 425-a from first time 405-a to second time 410-a (which may also be referred to as t). The interval between first time 405-a and second time 410-a may correspond to a pre-read portion of polarity SET write operation 435-a. In some cases, such as in timing diagram 400-a, first demarcation voltage 425-a may be sufficient to cause the memory cell to snap during the pre-read portion of polarity SET write operation 435-a. That is, a level of current that flows through the memory cell during the pre-read portion may exceed a threshold. After detecting a snap condition for the memory cell, the memory device may determine that the memory cell previously stored a SET state. Based on determining that the state to be written to the memory cell is the same as the state stored by the memory cell, the memory device may apply a voltage of a neutral polarity across the memory cell at second time 410-a through third time 415-a (which may also be referred to as $t_2$). The interval between second time 410-a and third time 415-a may correspond to a programming portion of polarity SET write operation 435-a. Accordingly, the memory cell may be read-refreshed by polarity SET write operation 435-a—that is, the memory cell may maintain the SET state after polarity SET write operation 435-a is completed.

Figure 4B:
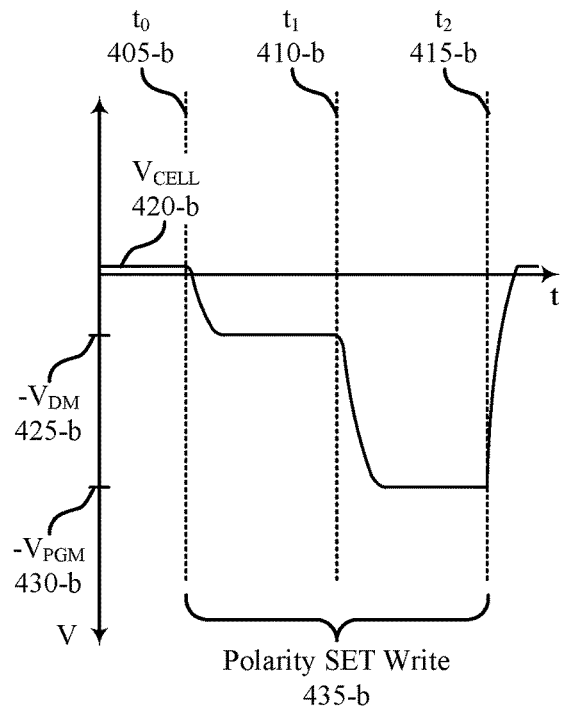

As illustrated in FIG. 4B, a memory device may receive a set of data (e.g., data 305) including a bit (e.g., first bit 310) that is to be written to a memory cell (e.g., first memory cell 335). After receiving the data, the memory device may determine a state represented by the bit and a polarity for a pre-read voltage based on the state represented by the bit. The memory device may determine that a SET state is represented by the bit and apply a negative voltage across the memory cell during a pre-read portion of polarity SET write operation 435-b, as similarly described with reference to FIG. 4A. A voltage applied across the memory cell during polarity SET write operation 435-b may be represented as cell voltage 420-b. Prior to performing polarity SET write operation 435-b, the memory cell may have an initial voltage (e.g., 0V or virtual ground).

At first time 405-b, the memory device may initiate polarity SET write operation 435-b by applying first demarcation voltage 425-b with a negative polarity. The memory device may apply first demarcation voltage 425-b from first time 405-b to second time 410-b. The interval between first time 405-b and second time 410-b may correspond to a pre-read portion of polarity SET write operation 435-b. In some cases, such as in timing diagram 400-b, first demarcation voltage 425-b may not be sufficient to cause the memory cell to snap during the pre-read portion of polarity SET write operation 435-b. That is, a level of current that flows through the memory cell during the pre-read portion may not exceed a threshold—e.g., no current may flow through the memory cell. In some examples, first demarcation voltage 425-b may fail to cause the memory cell to snap based on the memory cell storing a RESET state prior to polarity SET write operation 435-b. In other examples, first demarcation voltage 425-b may fail to cause the memory cell to snap when the memory cell stores a SET state prior to polarity SET write operation 435-b—e.g., if a negative threshold voltage of the memory cell is below (or has drifted below) first demarcation voltage 425-b.

If no snap condition is detected by the memory device, the memory device may be unable to detect a previously stored state of the memory cell and may apply first programming voltage 430-b (which may also be referred to as $V_{PGM}$) across the memory cell at second time 410-b through third time 415-b. First programming voltage 430-b may have a negative polarity. The interval between second time 410-b and third time 415-b may correspond to a programming portion of polarity SET write operation 435-b. First programming voltage 430-b may be sufficient to cause the memory cell to snap during the programming portion of polarity SET write operation 435-b, regardless of whether the memory cell stores a SET or RESET state. Accordingly, a negative current may flow through the memory cell, and the memory cell may be programmed to a SET logic state by polarity SET write operation 435-b.

Figure 4C:
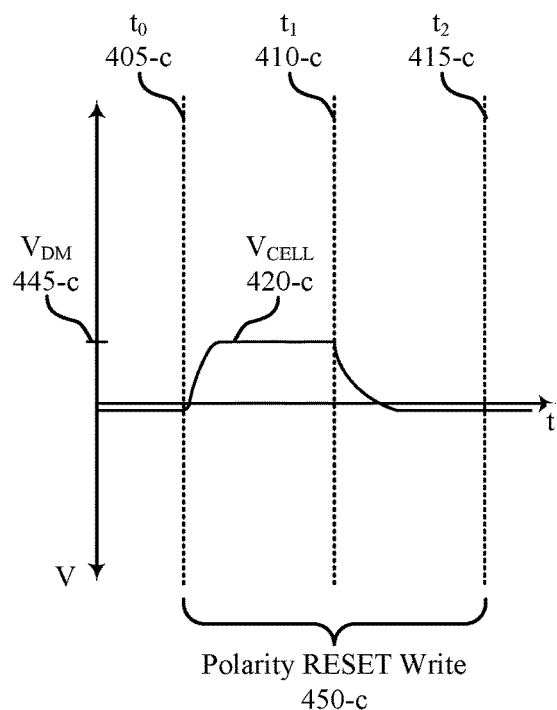

As illustrated in FIG. 4C, a memory device may receive a set of data (e.g., data 305) including a bit (e.g. second bit 315) that is to be written to a memory cell (e.g., second memory cell 340 of FIG. 3). After receiving the data, the memory device may determine a state represented by the bit and a polarity for a pre-read voltage based on the state represented by the bit. For example, the memory device may determine that a RESET state is represented by the bit, and thus, that a positive voltage is to be used during a pre-read operation of polarity RESET write operation 450-c. After determining the polarity of the pre-read voltage, the memory device may perform polarity RESET write operation 450-c for the memory cell. A voltage applied across the memory cell during a pre-read portion of polarity RESET write operation 450-c may be represented as cell voltage 420-c. Prior to performing polarity RESET write operation 450-c, the memory cell may have an initial voltage (e.g., 0V or virtual ground).

At first time 405-c, the memory device may initiate polarity RESET write operation 450-c by applying second demarcation voltage 445-c with a positive polarity. The memory device may apply second demarcation voltage 445-c from first time 405-c to second time 410-c. The interval between first time 405-c and second time 410-c may correspond to a pre-read portion of polarity RESET write operation 450-c. In some cases, such as in timing diagram 400-c, second demarcation voltage 445-c may be sufficient to cause the memory cell to snap during the pre-read portion of polarity RESET write operation 450-c. That is, the memory device may detect that a level of current that flows through the memory cell during the pre-read exceeds a threshold. After detecting a snap condition for the memory cell, the memory device may determine that the memory cell previously stored a RESET state. Thus, the memory device may apply a voltage of a neutral polarity across the memory cell at second time 410-c through third time 415-c. The interval between second time 410-c and third time 415-c may correspond to a programming portion of polarity RESET write operation 450-c. Accordingly, the memory cell may be read-refreshed by polarity RESET write operation 450-c—that is the memory cell may maintain the RESET state after polarity RESET write operation 450-c is completed.

Figure 4D:
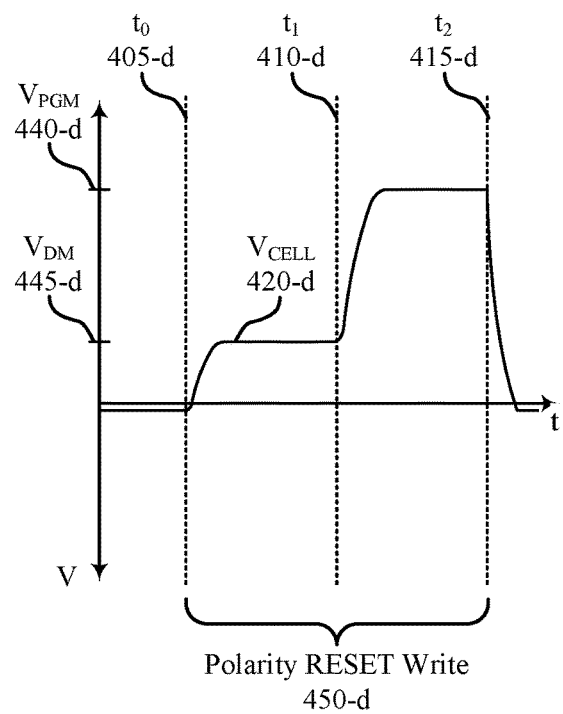

As illustrated in FIG. 4D, a memory device may receive a set of data including a bit that is to be written to a memory cell. After receiving the data, the memory device may determine a state represented by the bit and a polarity for a pre-read voltage based on the state represented by the bit. The memory device may determine that a RESET state is represented by the bit and apply a positive voltage across the memory cell during a pre-read operation of polarity RESET write operation 450-d, as similarly described with reference to FIG. 4C. A voltage applied across the memory cell during a pre-read portion of polarity RESET write operation 450-d may be represented as cell voltage 420-d. Prior to performing polarity RESET write operation 450-c, the an initial voltage (e.g., 0V or virtual ground) may be applied across the memory cell.

At first time 405-d, the memory device may initiate polarity RESET write operation 450-d by applying second demarcation voltage 445-d with a positive polarity. The memory device may apply second demarcation voltage 445-d from first time 405-d to second time 410-d. The interval between first time 405-d and second time 410-d may correspond to a pre-read portion of polarity RESET write operation 450-d. In some cases, such as in timing diagram 400-d, second demarcation voltage 445-d may not be sufficient to cause the memory cell to snap during the pre-read portion of the polarity RESET write operation 450-d. That is, a level of current that flows through the memory cell during the pre-read portion may not exceed a threshold—e.g., no current may flow through the memory cell. In some examples, second demarcation voltage 445-d may fail to cause the memory cell to snap based on the memory cell storing a SET state prior to the polarity write operation. In other examples, second demarcation voltage 445-d may fail to cause the memory cell to snap when the memory cell stores a RESET state prior to the polarity write operation—e.g., if a positive threshold voltage of the memory cell is above (or has drifted above) second demarcation voltage 445-d.

If no snap condition is detected by the memory device, the memory device may apply second programming voltage 440-d, which may have a positive polarity, across the memory cell at second time 410-d through third time 415-d. The interval between second time 410-d and third time 415-d may correspond to a programming portion of polarity RESET write operation 450-d. Second programming voltage 440-d may be sufficient to cause the memory cell to snap during the programming portion of polarity RESET write operation 450-d, regardless of whether the memory cell stores a SET or RESET state. Accordingly, a positive current may flow through the memory cell, and the memory cell may be programmed to a RESET logic state by polarity RESET write operation 450-d.

In some cases, the magnitude of first demarcation voltage 425, second demarcation voltage 445, first programming voltage 430, and/or second programming voltage 440 may change over time. For example, the magnitude of first demarcation voltage 425, second demarcation voltage 445, first programming voltage 430-b, or second programming voltage 440-d may be modified over time to accommodate for changes in threshold voltages of the memory cells—e.g., based on drift or usage of the memory cells. In some examples, a magnitude of threshold voltages of the memory cells may increase over time, and a magnitude of first demarcation voltage 425, second demarcation voltage 445, first programming voltage 430, and/or second programming voltage 440 may also be increased. In some examples, the values of first demarcation voltage 425, second demarcation voltage 445, first programming voltage 430, and/or second programming voltage may be cycled in accordance with a sequence. For example, sets of values used by first demarcation voltage 425, second demarcation voltage 445, first programming voltage 430, and/or second programming voltage may include an initial value and subsequently increasing values that may be cycled through by a memory device.

Figure 5:
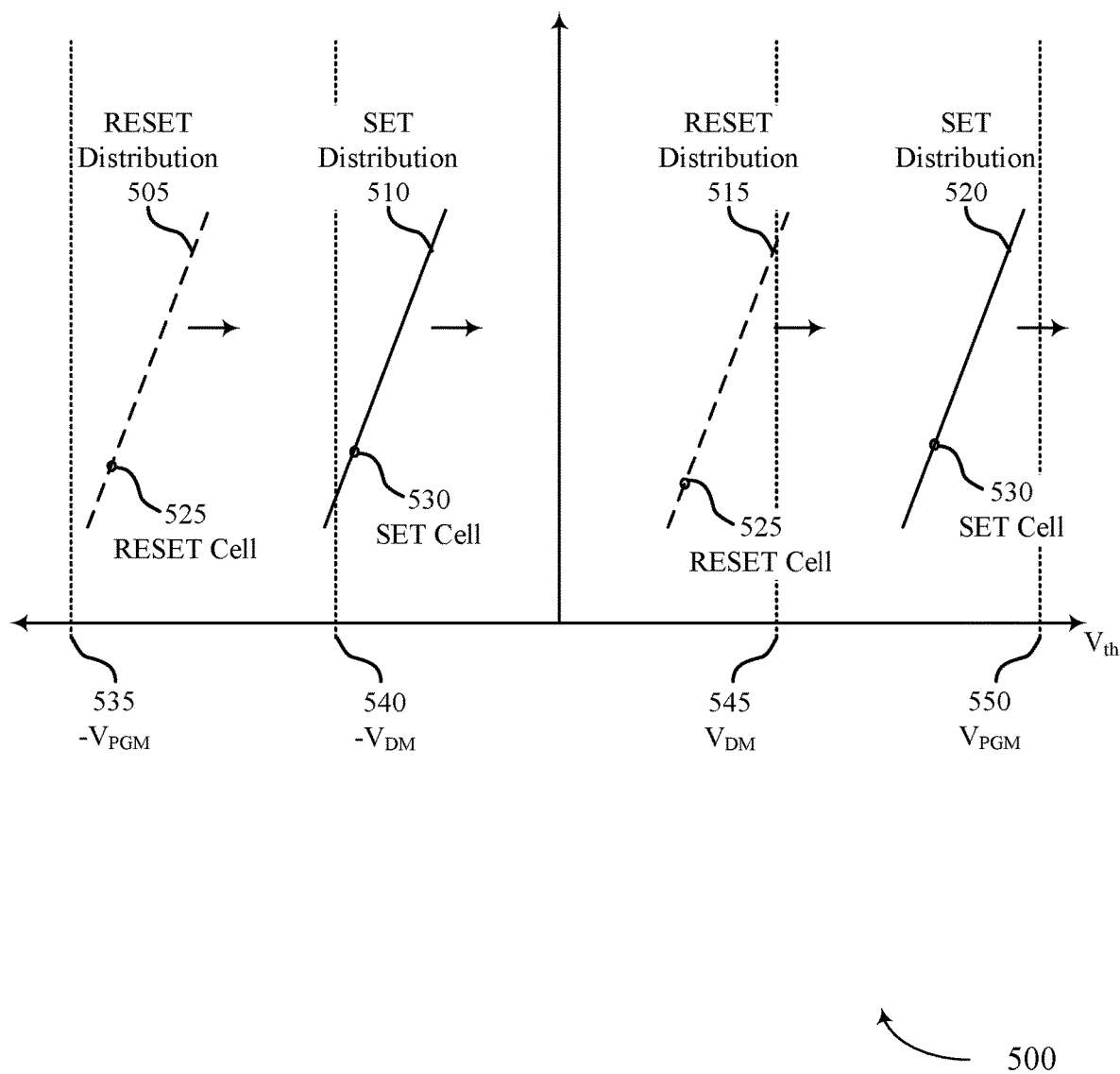
FIG. 5 illustrates an example of a distribution diagram that supports data-based polarity write operations in accordance with examples as disclosed herein.

FIG. 5 illustrates an example of a distribution diagram that supports data-based polarity write operations in accordance with examples as disclosed herein. Distribution diagram 500 may illustrate a distribution of threshold voltages for memory cells in a memory array. Threshold voltage distribution lines, such as negative RESET distribution line 505 and negative SET distribution line 510, may correspond to negative threshold voltages for cells storing a RESET state and cells storing a SET state, respectively. Threshold voltage distribution lines, such as positive RESET distribution line 515 and positive SET distribution line 520, may correspond to positive threshold voltages for cells storing a RESET state and cells storing a SET state, respectively.

In some cases, a memory cell may have a positive threshold voltage and a negative threshold voltage corresponding to a snap condition of the memory cell. The threshold voltage may depend on the state stored by the memory cell. For example, a memory cell that stores a SET state (e.g., SET cell 530) may have a negative threshold voltage that falls along negative SET distribution line 510 and a positive threshold voltage that falls along positive SET distribution line 520. And a memory cell that stores a RESET state (e.g., RESET cell 525) may have a negative threshold voltage that falls along negative RESET distribution line 505 and a positive threshold voltage that falls along positive RESET distribution line 515.

Due to the distribution of threshold voltages, a threshold voltage of RESET cell 525 may be exceeded (and thus a snap condition for RESET cell 525 achieved) at a different voltage than another cell in the memory array storing a RESET state. Similarly, a threshold voltage of SET cell 530 may be exceeded (and thus a snap condition for SET cell 530 achieved) at a different voltage than another cell in the memory array storing a SET state. Thus, a pre-read voltage, such as negative demarcation voltage 540 (which may be an example of a first demarcation voltage 425 of FIG. 4) or positive demarcation voltage 545 (which may be an example of a second demarcation voltage 445 of FIG. 4), applied during a pre-read portion of a polarity write operation may cause a portion of the cells storing a RESET state or a portion of cells storing a SET state in the memory array to reach a snap condition.

For example, if negative demarcation voltage 540 is applied across a set of memory cells during the pre-read portion of a polarity SET write operation, the memory cells having a smaller threshold voltage (e.g., memory cells storing SET states, such as SET cell 530) may experience a snapping event, while the other memory cells having a larger threshold voltage (memory cell cells storing RESET states, such as RESET cell 525, as well as a portion of the memory cells storing SET states) may not experience a snapping event. Similarly, if positive demarcation voltage 545 is applied across memory cells storing a RESET state during the pre-read portion of a polarity RESET write operation, the memory cells having a smaller threshold voltage (e.g., memory cells storing RESET states, such as RESET cell 525) may experience a snapping event, while the other memory cells having a larger threshold voltage (memory cell cells storing SET states, such as SET cell 530, as well as a portion of the memory cells storing RESET states) may not experience a snapping event.

In some cases, a memory device may increase a likelihood that a snap condition is achieved for memory cells that fail to snap when a demarcation voltage is applied by applying, during a programming portion of a write operation, another voltage with the same polarity as the demarcation voltage. For example, during a programming portion of a polarity SET write operation for RESET cell 525, a memory device may apply negative programming voltage 535 (which may be an example of a first programming voltage 430 of FIG. 4) across RESET cell 525 to ensure a snap condition is satisfied for, and a SET state is written to, RESET cell 525. Negative programming voltage 535 may similarly be applied across a memory cell storing a SET state that failed to snap during a pre-read portion to ensure that a snap condition is satisfied for, and a SET state is written to, the memory cell. In a similar example, during a programming portion of a polarity RESET write operation, a memory device may apply positive programming voltage 550 (which may be an example of a second programming voltage 440 of FIG. 4) across SET cell 530 to ensure a snap condition is satisfied, and a RESET state is written to, SET cell 530. Positive programming voltage 550 may similarly be applied across a memory cell storing a RESET state that failed to snap during a pre-read portion to ensure that a snap condition is satisfied for, and a RESET state is written to, the memory cell.

In some cases, the threshold voltage of a memory cell may change over time, which may be referred to as drift. The threshold voltage of a memory cell may drift between access operations—the longer a duration between access operations, the more threshold voltage drift may occur for a memory cell. The threshold voltage of a memory cell may also drift based on usage of a memory cell—e.g., the threshold voltage of a memory cell may be a function of a number of times the memory cell has been accessed. In some examples, threshold voltage drift may cause the threshold voltages for RESET cell 525 and SET cell 530 to increase.

As illustrated in FIG. 5, the threshold voltages may drift in a same, positive direction (on average), which may cause a magnitude of negative RESET distribution line 505 and negative SET distribution line 510 to decrease and a magnitude of positive RESET distribution line 515 and positive SET distribution line 520 to increase. In some examples, a threshold voltage of RESET cell 525 and SET cell 530 may drift such that a snap condition will not be satisfied for RESET cell 525 when positive demarcation voltage 545 is applied. The threshold voltage of RESET cell 525 and SET cell 530 may further drift such that a snap condition will not be satisfied for SET cell 530 when positive programming voltage 550 is applied. Thus, a polarity write operation may fail to write a logic state to some memory cells even after applying positive programming voltage 550.

It may be beneficial for the memory device to select a type of write operation based on amount of threshold voltage drift experienced by (or expected for) a memory cell. In some examples, if the threshold voltage of one or more memory cells is expected to exceed a magnitude of positive programming voltage 550, the memory device may select a default write operation that uses a negative pre-read voltage during a pre-read portion of the default write operation. The negative pre-read voltage (which may be equivalent to negative demarcation voltage 540) may cause all (or more) of the positively-drifted memory cells storing a SET state to experience a snap condition. Also, a negative programming voltage applied during a programming portion of the default write operation (which may be equivalent to negative programming voltage 535) may cause all (or more) of the positively drifted memory cells storing a RESET state to experience a snap condition. Further, a positive programming voltage applied during a programming portion of the default write operation (which may be equivalent to positive programming voltage 550) may cause the remaining positively-drifted memory cells storing the SET state to experience a snap condition—because the memory cells storing a SET state that fail to snap when the negative pre-read voltage is applied may have positive threshold voltages at the lower end of positive SET distribution line 520. In some cases, a modified default write operation may be configured to always use a positive pre-read voltage when a threshold voltage of the memory cells drift in a negative direction (on average). A default write operation is discussed in more detail herein and with reference to FIGS. 6A through 6C.

In some examples, if the threshold voltage of one or more memory cells is expected to exceed a magnitude of positive programming voltage 550, the memory device may select a force write operation that uses a force write programming voltage that is larger than positive programming voltage 550, or vice versa. By using a force write operation, the memory device may ensure that all (or most) of the positively-drifted memory cells in a memory array will experience a snap condition. A force write operation is discussed in more detail herein and with reference to FIGS. 7A and 7B.

Figure 6A:
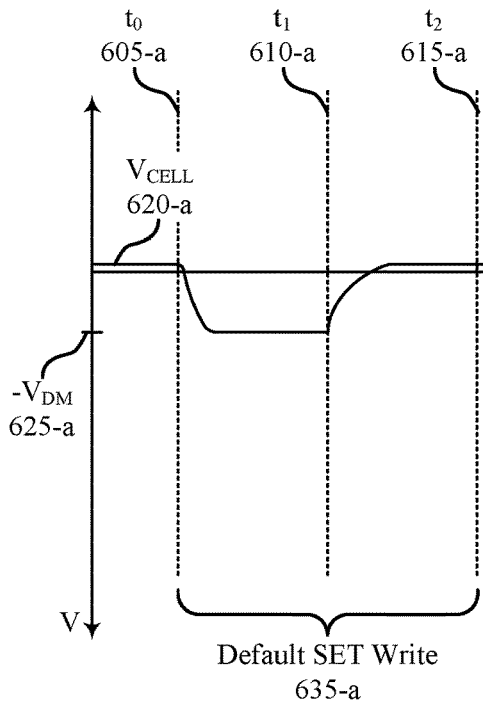
FIGS. 6A through 6C illustrate examples of timing diagrams that support data-based polarity write operations in accordance with examples as disclosed herein.
Figure 6B:
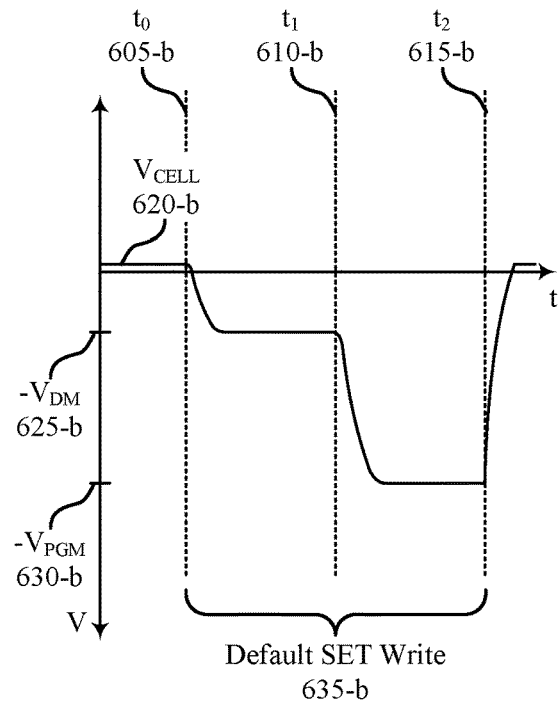
Figure 6C:
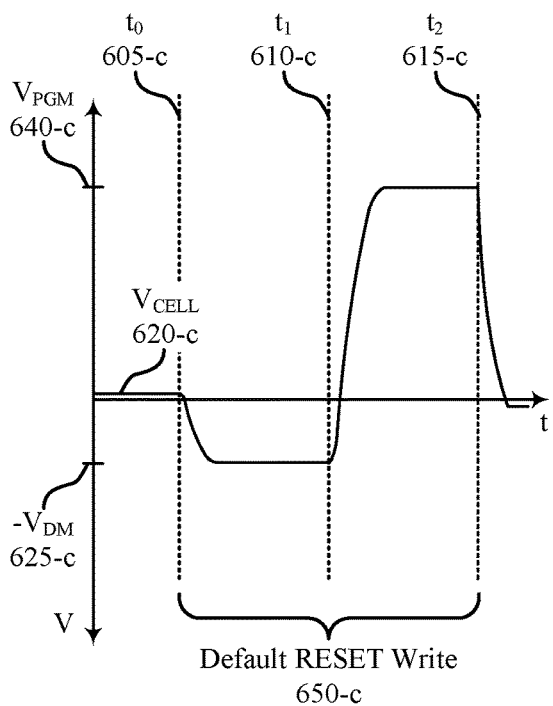

FIGS. 6A through 6C illustrate examples of timing diagrams that support data-based polarity write operations in accordance with examples as disclosed herein. Timing diagrams 600 may illustrate voltages applied across a memory cell in a memory array over time during different default write operations. For example, timing diagram 600-*a* and timing diagram 600-*b* may illustrate default write operations for writing a bit having a SET state (e.g., first bit 310 of FIG. 3), while timing diagram 600-*c* may illustrate a default write operation for writing a bit having a RESET state (e.g., second bit 315 of FIG. 3).

In some cases, as shown in timing diagram 600-*a*, a voltage applied across a memory cell during a pre-read portion of a default write operation may satisfy a threshold associated with a snap condition in which the memory cell conducts charge. In other cases, as shown in timing diagram 600-*b*, a voltage applied across a memory cell during a pre-read portion of a default write operation may not satisfy a snap condition for the memory cell. Whether the snap condition is met may determine the magnitude of a voltage applied to the memory cell during a programming portion of the default write operation. In some examples, such as shown in timing diagram 600-*c*, a memory device may apply a positive programming voltage during a programming operation of a default write operation regardless of whether the memory cell satisfies the threshold for the snap condition during the pre-read portion of the default write operation— e.g., based on writing a bit having a RESET state.

As illustrated in FIG. 6A, a memory device may receive a set of data (e.g., data 305 of FIG. 3) including a bit (e.g., first bit 310 of FIG. 3) that is to be written to a memory cell (e.g., first memory cell 335 of FIG. 3). After receiving the data, the memory device may determine a negative pre-read voltage is to be applied across the memory cell during a pre-read portion of default SET write operation 635-*a* regardless of the state represented by the bit. In some cases, a SET state may be represented by the bit. The memory device may further determine a programming voltage based on the state represented by the bit and/or a state sensed from the memory cell during the pre-read portion of default SET write operation 635-*a*. A voltage applied across the memory cell during default SET write operation 635-*a* may be represented as cell voltage 620-*a* (which may also be referred to as $V_{CELL}$). Prior to performing default SET write operation 635-*a*, the memory cell may have an initial voltage (e.g., 0V or virtual ground).

At first time 605-*a* (which may also be represented as to), the memory device may initiate default SET write operation 635-*a* by applying demarcation voltage 625-*a* with a negative polarity. The memory device may apply demarcation voltage 625-*a* (which may also be referred to as $V_{DM}$) from first time 605-*a* to second time 610-*a* (which may be represented as $t_1$). The interval between first time 605-*a* and second time 610-*a* may correspond to a pre-read portion of default SET write operation 635-*a*. In some cases, such as in timing diagram 600-*a*, demarcation voltage 625-*a* may be sufficient to cause the memory cell to satisfy a snap condition during the pre-read portion of default SET write operation 635-*a*—e.g., if the memory cell stores a SET state. That is, a level of current that flows through the memory cell during the pre-read portion may exceed a threshold. After detecting a snap condition for the memory cell, the memory device may determine that the memory cell previously stored a SET state. Based on determining that the state to be written to the memory cell is the same as the state stored by the memory cell, the memory device may apply a voltage of a neutral polarity across the memory cell at second time 610-*a* through third time 615-*a* (which may be represented as $t_2$). The interval between second time 610-*a* and third time 615-*a* may correspond to a programming portion of default SET write operation 635-*a*. Accordingly, the memory cell may be read-refreshed by default SET write operation 635-*a*—that is, the memory cell may maintain the SET state after default SET write operation 635-*a* is completed.

As illustrated in FIG. 6B, a memory device may receive a set of data (e.g., data 305) including a bit (e.g., first bit 310) that is to be written to a memory cell (e.g., first memory cell 335). After receiving the data, the memory device may determine a negative pre-read voltage is to be applied across the memory cell during a pre-read portion of default SET write operation 635-*b* and determine a programming voltage during a programming portion of default SET write operation 635-*b* based on the state represented by the bit and/or a state stored by the memory cell, as similarly described with reference to FIG. 6A. A voltage applied across the memory cell during default SET write operation 635-*b* may be represented as cell voltage 620-*b*. Prior to performing default SET write operation 635-*b*, the memory cell may have an initial voltage (e.g., 0V or virtual ground).

At first time 605-*b*, the memory device may initiate default SET write operation 635-*b* by applying demarcation voltage 625-*b* with a negative polarity. The memory device may apply demarcation voltage 625-*b* from first time 605-*b* to second time 610-*b*. The interval between first time 605-*b* and second time 610-*b* may correspond to a pre-read portion of default SET write operation 635-*b*. In some cases, such as in timing diagram 600-*b*, demarcation voltage 625-*b* may not be sufficient to cause the memory cell to snap during the pre-read portion of default SET write operation 635-*b*. That is, a level of current that flows through the memory cell during the pre-read portion may not exceed a threshold. In some examples, demarcation voltage 625-*b* may fail to cause the memory cell to snap based on the memory cell storing a RESET state prior to default SET write operation 635-*b*. In some examples, demarcation voltage 625-*b* may fail to cause the memory cell to snap when the memory cell stores a SET state prior to default SET write operation 635-*b*—e.g., if a threshold voltage of the memory cell is below (or has drifted below) demarcation voltage 625-*b*.

If no snap condition is detected by the memory device, the memory device may be unable to detect a previously stored state of the memory cell and may apply first programming voltage 630-*b* (which may also be referred to as $V_{PGM}$) across the memory cell at second time 610-*b* through third time 615-*b*. First programming voltage 630-*b* may have a negative polarity. The interval between second time 610-*b* and third time 615-*b* may correspond to a programming portion of default SET write operation 635-*b*. First programming voltage 630-*b* may be sufficient to cause the memory cell to snap during the programming portion of default SET write operation 635-*b*, regardless of whether the memory cell stores a SET or RESET state. Accordingly, a negative current may flow through the memory cell, and the memory cell may be programmed to a SET logic state by default SET write operation 635-*b*.

As illustrated in FIG. 6C, a memory device may receive a set of data (e.g., data 305) including a bit (e.g., second bit 315) that is to be written to a memory cell (e.g., second memory cell 340 of FIG. 3). After receiving the data, the memory device may determine a negative pre-read voltage is to be applied during a pre-read portion of default RESET write operation 650-*c*, as similarly described with reference to FIG. 6A. In some cases, a RESET state may be represented by the bit. The memory device may further determine a programming voltage based on the state represented by the bit and/or a state sensed from the memory cell during default RESET write operation 650-*c*. A voltage applied across the memory cell during default RESET write operation 650-*c* may be represented as cell voltage 620-*c*. Prior to performing default RESET write operation 650-*c*, the memory cell may have an initial voltage (e.g., 0V or virtual ground).

At first time 605-*c*, the memory device may initiate default RESET write operation 650-*c* by applying demarcation voltage 625-*c* with a negative polarity. The memory device may apply demarcation voltage 625-*c* from first time 605-c to second time 610-c. The interval between first time 605-c and second time 610-c may correspond to a pre-read portion of default RESET write operation 650-c. In some cases, such as in timing diagram 600-c, demarcation voltage 625-c may be sufficient to cause the memory cell to snap during the pre-read portion of default RESET write operation 650-c—e.g., if the memory cell stores a SET state. In other cases, demarcation voltage 625-c may not be sufficient to cause the memory cell to snap during the pre-read portion of default RESET write operation 650-c—e.g., if the memory cell stores a RESET state or when a memory cell storing a SET state has a larger threshold voltage than demarcation voltage 625-c. Regardless, based on determining that a RESET bit is to be written to the memory cell, the memory device may apply second programming voltage 640-c across the memory cell at second time 610-c through third time 615-c. Second programming voltage 640-c may have a positive polarity. The interval between second time 610-c and third time 615-c may correspond to a programming portion of default RESET write operation 650-c. Accordingly, a positive current may flow through the memory cell, and the memory cell may be programmed to a RESET logic state by default RESET write operation 650-c.

In some cases, as with the polarity write operations described with reference to FIGS. 4A through 4D, the magnitude of demarcation voltage 625, first programming voltage 630, and/or second programming voltage 640-a may change over time. For example, the magnitude of demarcation voltage 625, first programming voltage 630-b, or second programming voltage 640-c may be modified over time to accommodate for changes in threshold voltages of the memory cells—e.g., based on drift or usage of the memory cells. In some examples, a magnitude of threshold voltages of the memory cells may increase over time, and a magnitude of demarcation voltage 625, first programming voltage 630-b, and/or second programming voltage 640-c may be increased. In some examples, the values of demarcation voltage 625, first programming voltage 630-b, and/or second programming voltage 640-c may be cycled in accordance with a sequence.

Figure 7A:
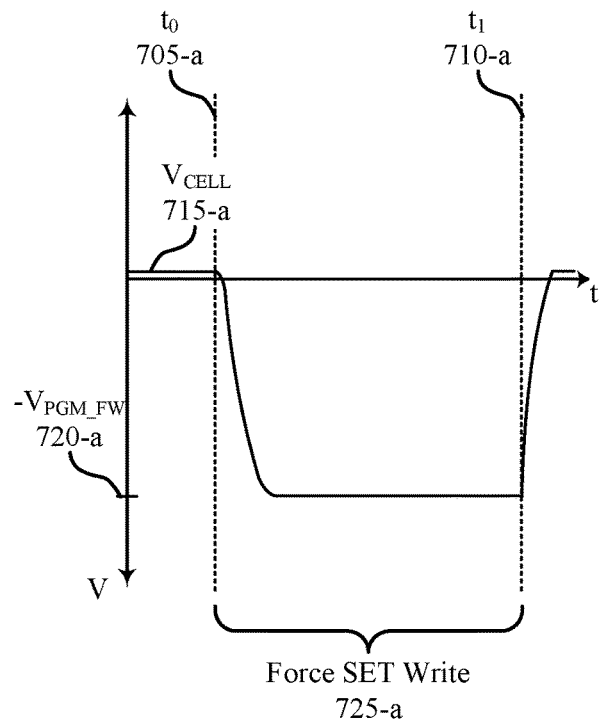
FIGS. 7A and 7B illustrate examples of timing diagrams that support data-based polarity write operations in accordance with examples as disclosed herein.
Figure 7B:
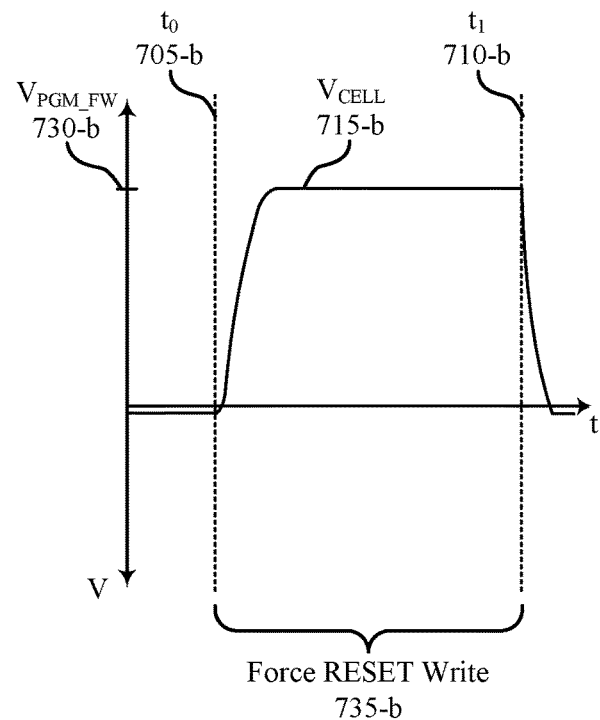

FIGS. 7A and 7B illustrate examples of timing diagrams that support data-based polarity write operations in accordance with examples as disclosed herein. Timing diagrams 700 may illustrate voltages applied across a memory cell in a memory array over time during different force write operations. For example, timing diagram 700-a may illustrate a force write operation for a bit having a SET state (e.g., first bit 310 of FIG. 3), while timing diagram 700-b may illustrate a force write operation for a bit having a RESET state (e.g., second bit 315 of FIG. 3).

As illustrated in FIG. 7A, a memory device may receive a set of data (e.g., data 305) including a bit (e.g., first bit 310) that is to be written to a memory cell (e.g., first memory cell 335 or second memory cell 340 of FIG. 3). After receiving the data, the memory device may determine a state represented by the bit and a polarity for a programming voltage based on the state represented by the bit. In some examples, the memory device may determine that a SET state is represented by the bit, and thus, that a negative voltage is to be applied across the memory cell during a programming portion of force SET write operation 725-a. In such cases, the programming portion may be coextensive with the write operation. After determining the polarity of the programming voltage, the memory device may perform force SET write operation 725-a for the memory cell. A voltage applied across the memory cell during force SET write operation 725-a may be represented as cell voltage 715-a (which may also be referred to as $V_{CELL}$). Prior to performing force SET write operation 725-a, the memory cell may have an initial voltage (e.g., 0V or virtual ground).

At first time 705-a (which may also be represented as t0), the memory device may initiate force SET write operation 725-a by applying first programming voltage 720-a (which may also be referred to as $V_{PGM\_FW}$). First programming voltage 720-a may be larger than the programming voltages described with reference to FIGS. 4A through 4D and 6A through 6C. The memory device may apply first programming voltage 720-a from first time 705-a to second time 710-a (which may be represented as t). The interval between first time 705-a and second time 710-a may correspond to a programming portion of force SET write operation 725-a. The first programming voltage 720-a may be sufficient to cause the memory cell to satisfy a snap condition in which the memory cell conducts charge during the programming portion, regardless of whether the memory cell stores a SET or RESET state. Accordingly, a negative current may flow through the memory cell, and the memory cell may be programmed to a SET logic state by force SET write operation 725-a.

As illustrated in FIG. 7B, a memory device may receive a set of data (e.g., data 305) including a bit (e.g., second bit 315) that is to be written to a memory cell (e.g., first memory cell 335 or second memory cell 340). After receiving the data, the memory device may determine a state represented by the bit and a polarity for a programming voltage based on the state represented by the bit, as similarly described with reference to FIG. 7A. In some examples, the memory device may determine that a RESET state is represented by the bit, and thus, that a positive voltage is to be applied across the memory cell during a programming operation of force RESET write operation 735-b. A voltage applied across the memory cell during force RESET write operation 735-b may be represented as cell voltage 715-b. Prior to performing force RESET write operation 735-b, the memory cell may have an initial voltage (e.g., 0V or virtual ground).

At first time 705-b, the memory device may initiate force RESET write operation 735-b by applying second programming voltage 730-b. The memory device may apply second programming voltage 730-b from first time 705-b to second time 710-b. The interval between first time 705-a and second time 710-a may correspond to a programming portion of force RESET write operation 735-b. The second programming voltage 730-b may be sufficient to cause the memory cell to satisfy a snap condition in which the memory cell conducts charge during the programming portion, regardless of whether the memory cell stores a SET or RESET state. Accordingly, a positive current may flow through the memory cell, and the memory cell may be programmed to a RESET logic state by force RESET write operation 735-b.

In some cases, s with the polarity write operations described with reference to FIGS. 4A through 4D, the magnitude of first programming voltage 720-a and/or second programming voltage 730-b may change over time. For example, the magnitude of first programming voltage 720-a and/or second programming voltage 730-b may be modified over time to accommodate for changes in threshold voltages of the memory cells—e.g., based on drift or usage of the memory cells. In some examples, a magnitude of threshold voltages of the memory cells may increase over time, and a magnitude of first programming voltage 720-a and/or second programming voltage 730-b may be increased. In some examples, the values of first programming voltage 720-*a* and/or second programming voltage 730-*b* may be cycled in accordance with a sequence.

Figure 8:
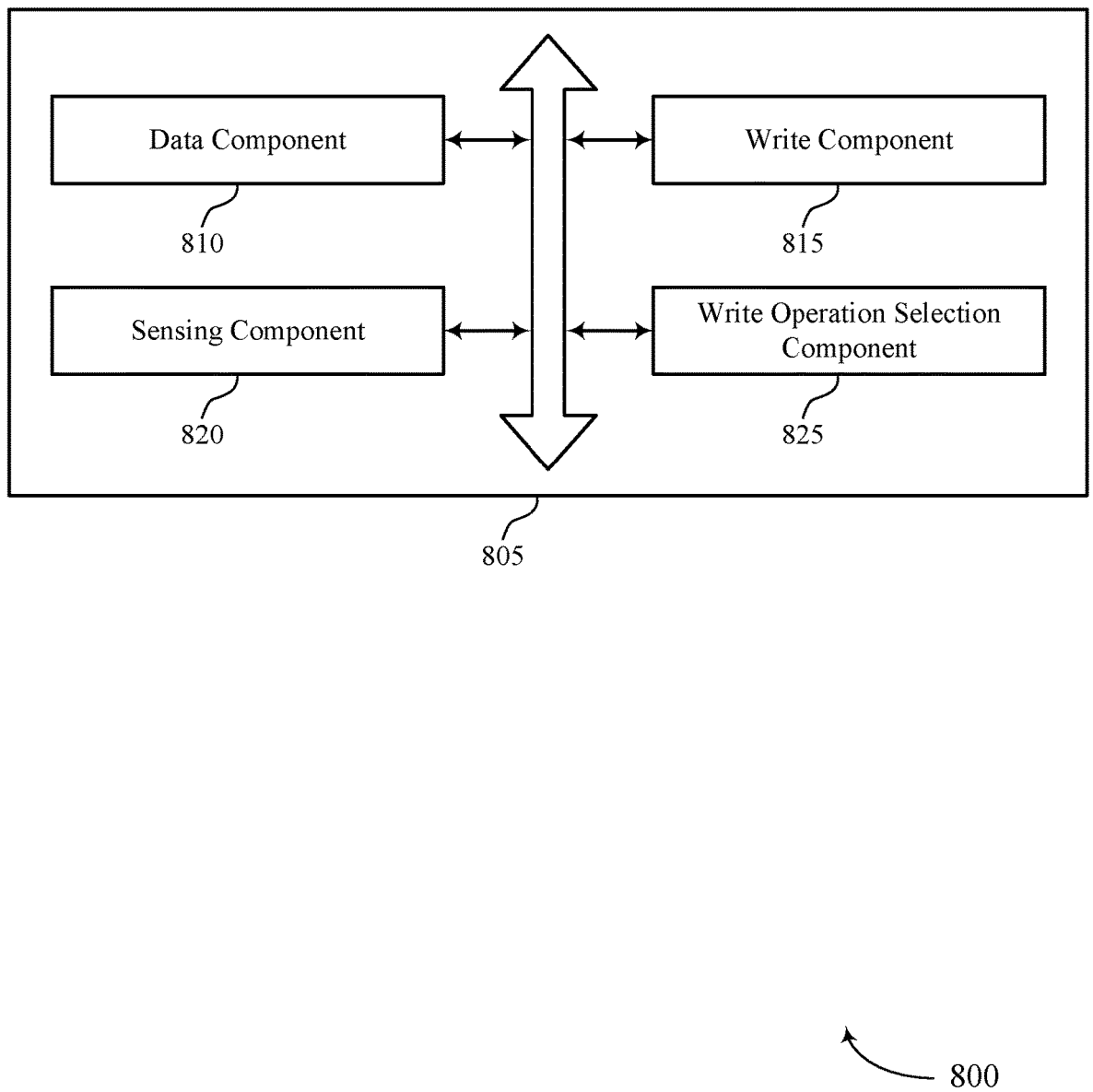
FIG. 8 shows a block diagram of a memory device that supports data-based polarity write operations in accordance with aspects of the present disclosure.

FIG. 8 shows a block diagram 800 of a memory controller 805 that supports data-based polarity write operations in accordance with examples as disclosed herein. The memory controller 805 may be an example of aspects of a memory device as described with reference to FIGS. 1 through 7.

As discussed herein, the memory controller 805 may be configured to perform a polarity write operation. The memory controller 805 may include a data component 810, a write component 815, a sensing component 820, and a write operation selection component 825. Each of these modules may communicate, directly or indirectly, with one another (e.g., via one or more buses).

The data component 810 may receive a write command and a set of data, the write command triggering a write operation to write the set of data to a set of memory cells, where a first bit of the set of data is to be written to a first memory cell of the set of memory cells and a second bit of the set of data is to be written to a second memory cell of the set of memory cells. In some cases, the first logic value of the first bit is associated with a SET state and the first polarity of the first voltage is a negative polarity. In some cases, the second logic value of the second bit is associated with a RESET state and the second polarity of the second voltage is a positive polarity.

The write component 815 may apply, during a first interval of the write operation, a first voltage having a first polarity across the first memory cell based on the first bit having a first logic value and a second voltage having a second polarity across the second memory cell based on the second bit having a second logic value. In some examples, the write component 815 may apply, during a second interval of the write operation, a third voltage across the first memory cell and a fourth voltage across the second memory cell based on an amount of charge conducted by the first memory cell and the second memory cell during the first interval of the write operation.

The sensing component 820 may detect that a first amount of charge conducted by the first memory cell during the first interval exceeds a threshold. In some cases, the third voltage applied by the write component 815 has a neutral polarity based on the first amount of charge exceeding the threshold. In some examples, the sensing component 820 may detect that a second amount of charge conducted by the second memory cell during the first interval exceeds a threshold. In some cases, the fourth voltage applied by the write component 815 has a neutral polarity based on the second amount of charge exceeding the threshold.

In some examples, the sensing component 820 may detect that a first amount of charge conducted by the first memory cell during the first interval is below a threshold. In some cases, the third voltage applied by the write component 815 has the first polarity and is larger than the first voltage based on the first amount of charge being below the threshold. In some examples, the sensing component 820 may detect that a second amount of charge conducted by the second memory cell during the first interval is below a threshold. In some cases, the fourth voltage applied by the write component 815 has the second polarity and is larger than the second voltage based on the second amount of charge being below the threshold.

In some examples, the data component 810 may receive a second write command and a second set of data that is associated with the second write command, the second write command triggering a second write operation for the set of memory cells, where a first bit of the second set of data is to be written to the first memory cell and a second bit of the second set of data is to be written to the second memory cell.

In some examples, the write component 815 may apply, during a first interval of the second write operation, a fifth voltage having the first polarity across the first memory cell based at least in part on the first bit of the second set of data having the first logic value and a sixth voltage having the second polarity across the second memory cell based at least in part on the second bit of the second set of data having the second logic value. In some examples, the write component 815 may apply, during a second interval of the second write operation, a seventh voltage across the first memory cell and an eighth voltage across the second memory cell based on a second amount of charge conducted by the first memory cell and the second memory cell during the first interval of the second write operation. The write component 815 may determine the fifth voltage, the sixth voltage, the seventh voltage, and the eighth voltage based on an operating life of the set of memory cells, an amount of drift associated with the set of memory cells, or both, prior to applying the fifth voltage, the sixth voltage, the seventh voltage, and the eighth voltage. In some examples, the write component 815 may determine the fifth voltage, the sixth voltage, the seventh voltage, and the eighth voltage in accordance with a voltage sequence prior to applying the fifth voltage, the sixth voltage, the seventh voltage, and the eighth voltage.

In some examples (e.g., during a default write operation), the write component 815 may apply, during a first interval of the second write operation, a fifth voltage having the first polarity across the first memory cell based on the first bit of the second set of data having the first logic value and a sixth voltage having the first polarity across the second memory cell based on the second bit of the second set of data having the second logic value. In some examples, the write component 815 may apply, during a second interval of the second write operation, the third voltage across the first memory cell and the fourth voltage across the second memory cell based on a second amount of charge conducted by the first memory cell and the second memory cell during the first interval of the second write operation. In some examples, the write component 815 may determine to apply the fifth and sixth voltages based on an amount of drift associated with the set of memory cells.

In some examples (e.g., during a force write operation), the write component 815 may apply, throughout the second write operation, a fifth voltage having the first polarity across the first memory cell based on the first bit of the second set of data having the first logic value and a sixth voltage having the second polarity across the second memory cell based on the second bit of the second set of data having the second logic value. In some examples, the write component 815 may determine to apply the fifth and sixth voltages based on a duration since a last access operation was performed for the set of memory cells.

As discussed herein, the memory controller 805 may be configured to select one of a polarity write operation, a default write operation, or a force write operation to write data to a memory cell.

The data component 810 may receive a set of write commands. In some cases, the set of write commands include a write command that addresses a set of memory cells.

The write component 815 may perform, for a first subset of the set of write commands, first write operations of a first type that include an application of a first voltage of a first polarity across memory cells being written to a first logic value and a second voltage of an opposite polarity across memory cells being written to a second logic value during pre-read periods of the first write operations. In some examples, the write component 815 may perform, for a second subset of the set of write commands, second write operations of a second type that include an application of the first voltage of the first polarity across memory cells being written to either the first logic value or the second logic value during pre-read periods of the second write operations. In some examples, the write component 815 may perform, for a second subset of the set of write commands, second write operations of a second type that include an application of the first voltage of the first polarity across memory cells being written to either the first logic value or the second logic value during pre-read periods of the second write operations.

Figure 9:
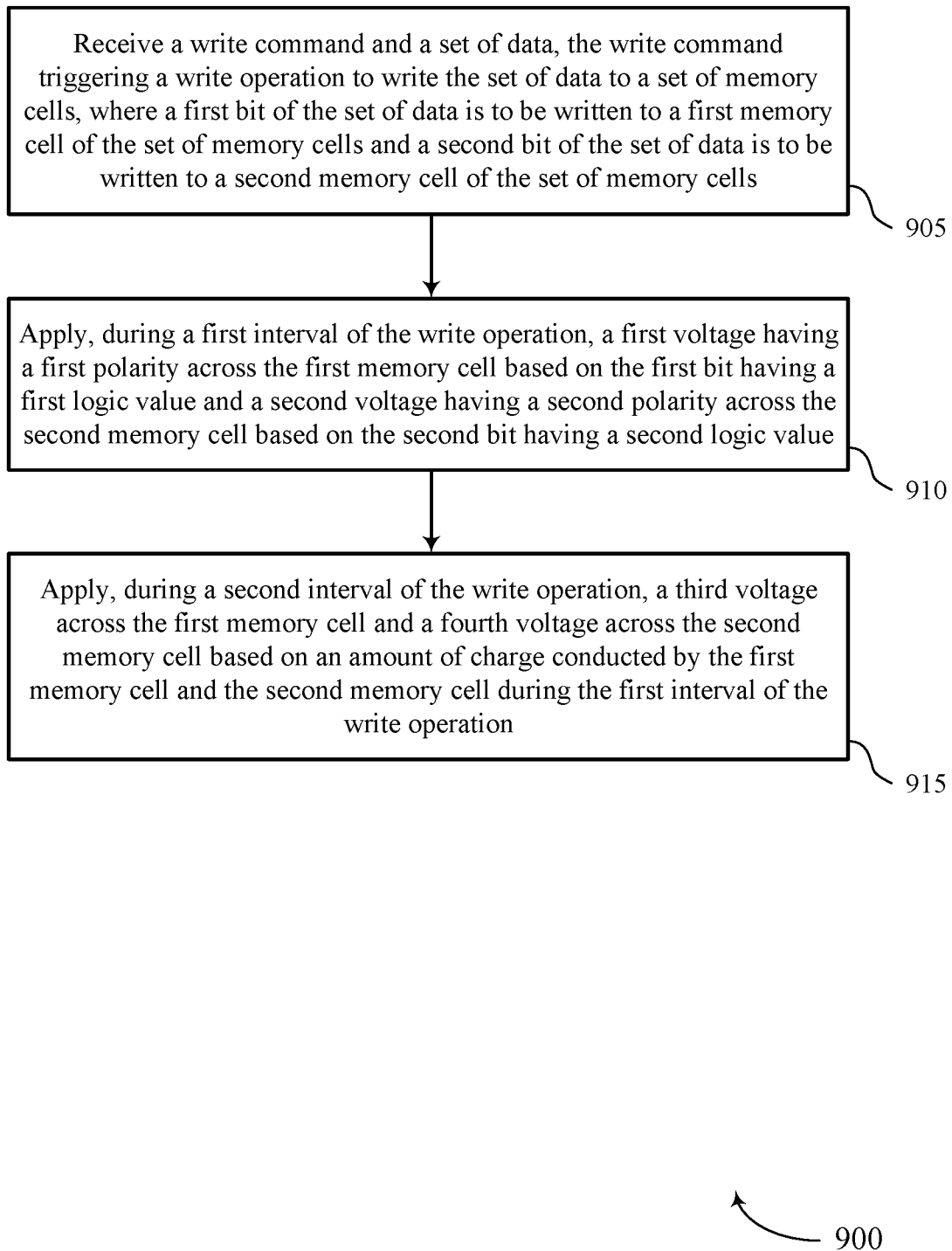
FIGS. 9 and 10 show flowcharts illustrating a method or methods that support data-based polarity write operations in accordance with examples as disclosed herein.

The write operation selection component 825 may activate the second type of write operation or the third type of write operation based on an amount of drift associated with the set of memory cells addressed by the write command included in the set of write commands. In some cases, the second type of write operation is activated when the amount of drift exceeds a first threshold and the third type of write operation is activated when the amount of drift exceeds a second threshold that is larger than the first threshold FIG. 9 shows a flowchart illustrating a method or methods 900 that supports data-based polarity write operations in accordance with aspects of the present disclosure. The operations of method 900 may be implemented by a memory device or its components as described herein. For example, the operations of method 900 may be performed by a memory controller as described with reference to FIG. 8. In some examples, a memory device may execute a set of instructions to control the functional elements of the memory device to perform the described functions. Additionally, or alternatively, a memory device may perform aspects of the described functions using special-purpose hardware.

At 905, the memory device may receive a write command and a set of data, the write command triggering a write operation to write the set of data to a set of memory cells, where a first bit of the set of data is to be written to a first memory cell of the set of memory cells and a second bit of the set of data is to be written to a second memory cell of the set of memory cells. The operations of 905 may be performed according to the methods described herein. In some examples, aspects of the operations of 905 may be performed by a data component as described with reference to FIG. 8.

At 910, the memory device may apply, during a first interval of the write operation, a first voltage having a first polarity across the first memory cell based on the first bit having a first logic value and a second voltage having a second polarity across the second memory cell based on the second bit having a second logic value. The operations of 910 may be performed according to the methods described herein. In some examples, aspects of the operations of 910 may be performed by a write component as described with reference to FIG. 8.

At 915, the memory device may apply, during a second interval of the write operation, a third voltage across the first memory cell and a fourth voltage across the second memory cell based on an amount of charge conducted by the first memory cell and the second memory cell during the first interval of the write operation. The operations of 915 may be performed according to the methods described herein. In some examples, aspects of the operations of 915 may be performed by a write component as described with reference to FIG. 8.

In some examples, an apparatus as described herein may perform a method or methods, such as the method 900. The apparatus may include features, means, or instructions (e.g., a non-transitory computer-readable medium storing instructions executable by a processor) for receiving a write command and a set of data, the write command triggering a write operation to write the set of data to a set of memory cells, where a first bit of the set of data is to be written to a first memory cell of the set of memory cells and a second bit of the set of data is to be written to a second memory cell of the set of memory cells, applying, during a first interval of the write operation, a first voltage having a first polarity across the first memory cell based on the first bit having a first logic value and a second voltage having a second polarity across the second memory cell based on the second bit having a second logic value, and applying, during a second interval of the write operation, a third voltage across the first memory cell and a fourth voltage across the second memory cell based on an amount of charge conducted by the first memory cell and the second memory cell during the first interval of the write operation.

Some examples of the method 900 and the apparatus described herein may further include operations, features, means, or instructions for detecting that a first amount of charge conducted by the first memory cell during the first interval exceeds a threshold, where the third voltage may have a neutral polarity based on the first amount of charge exceeding the threshold.

Some examples of the method 900 and the apparatus described herein may further include operations, features, means, or instructions for detecting that a second amount of charge conducted by the second memory cell during the first interval exceeds a threshold, where the fourth voltage may have a neutral polarity based on the second amount of charge exceeding the threshold.

Some examples of the method 900 and the apparatus described herein may further include operations, features, means, or instructions for detecting that a first amount of charge conducted by the first memory cell during the first interval may be below a threshold, where the third voltage may have the first polarity and may be larger than the first voltage based on the first amount of charge being below the threshold.

Some examples of the method 900 and the apparatus described herein may further include operations, features, means, or instructions for detecting that a second amount of charge conducted by the second memory cell during the first interval may be below a threshold, where the fourth voltage may have the second polarity and may be larger than the second voltage based on the second amount of charge being below the threshold.

Some examples of the method 900 and the apparatus described herein may further include operations, features, means, or instructions for receiving a second write command and a second set of data that may be associated with the second write command, the second write command triggering a second write operation for the set of memory cells, where a first bit of the second set of data may be to be written to the first memory cell and a second bit of the second set of data may be to be written to the second memory cell, applying, during a first interval of the second write operation, a fifth voltage having the first polarity across the first memory cell based on the first bit of the second set of data having the first logic value and a sixth voltage having the second polarity across the second memory cell based on the second bit of the second set of data having the second logic value, and applying, during a second interval of the second write operation, a seventh voltage across the first memory cell and an eighth voltage across the second memory cell based on a second amount of charge conducted by the first memory cell and the second memory cell during the first interval of the second write operation.

Some examples of the method 900 and the apparatus described herein may further include operations, features, means, or instructions for determining the fifth voltage, the sixth voltage, the seventh voltage, and the eighth voltage based on an operating life of the set of memory cells, an amount of drift associated with the set of memory cells, or both, prior to applying the fifth voltage, the sixth voltage, the seventh voltage, and the eighth voltage.

In some examples of the method 900 and the apparatus described herein, the fifth voltage may be greater than the first voltage, the sixth voltage may be greater than the second voltage, the seventh voltage may be greater than the third voltage, and the eighth voltage may be greater than the fourth voltage.

Some examples of the method 900 and the apparatus described herein may further include operations, features, means, or instructions for determining the fifth voltage, the sixth voltage, the seventh voltage, and the eighth voltage in accordance with a voltage sequence prior to applying the fifth voltage, the sixth voltage, the seventh voltage, and the eighth voltage.

Some examples of the method 900 and the apparatus described herein may further include operations, features, means, or instructions for receiving a second write command and a second set of data that may be associated with the second write command, the second write command triggering a second write operation for the set of memory cells, where a first bit of the second set of data may be to be written to the first memory cell and a second bit of the second set of data may be to be written to the second memory cell, applying, during a first interval of the second write operation, a fifth voltage having the first polarity across the first memory cell based on the first bit of the second set of data having the first logic value and a sixth voltage having the first polarity across the second memory cell based on the second bit of the second set of data having the second logic value, and applying, during a second interval of the second write operation, the third voltage across the first memory cell and the fourth voltage across the second memory cell based on a second amount of charge conducted by the first memory cell and the second memory cell during the first interval of the second write operation.

Some examples of the method 900 and the apparatus described herein may further include operations, features, means, or instructions for determining to apply the fifth and sixth voltages based on an amount of drift associated with the set of memory cells.

Some examples of the method 900 and the apparatus described herein may further include operations, features, means, or instructions for receiving a second write command and a second set of data that may be associated with the second write command, the second write command triggering a second write operation for the set of memory cells, where a first bit of the second set of data may be to be written to the first memory cell and a second bit of the second set of data may be to be written to the second memory cell, and applying, throughout the second write operation, a fifth voltage having the first polarity across the first memory cell based on the first bit of the second set of data having the first logic value and a sixth voltage having the second polarity across the second memory cell based on the second bit of the second set of data having the second logic value.

Some examples of the method 900 and the apparatus described herein may further include operations, features, means, or instructions for determining to apply the fifth and sixth voltages based on a duration since a last access operation was performed for the set of memory cells.

In some examples of the method 900 and the apparatus described herein, the first logic value of the first bit may be associated with a SET state and the first polarity of the first voltage may be a negative polarity, and the second logic value of the second bit may be associated with a RESET state and the second polarity of the second voltage may be a positive polarity.

Figure 10:
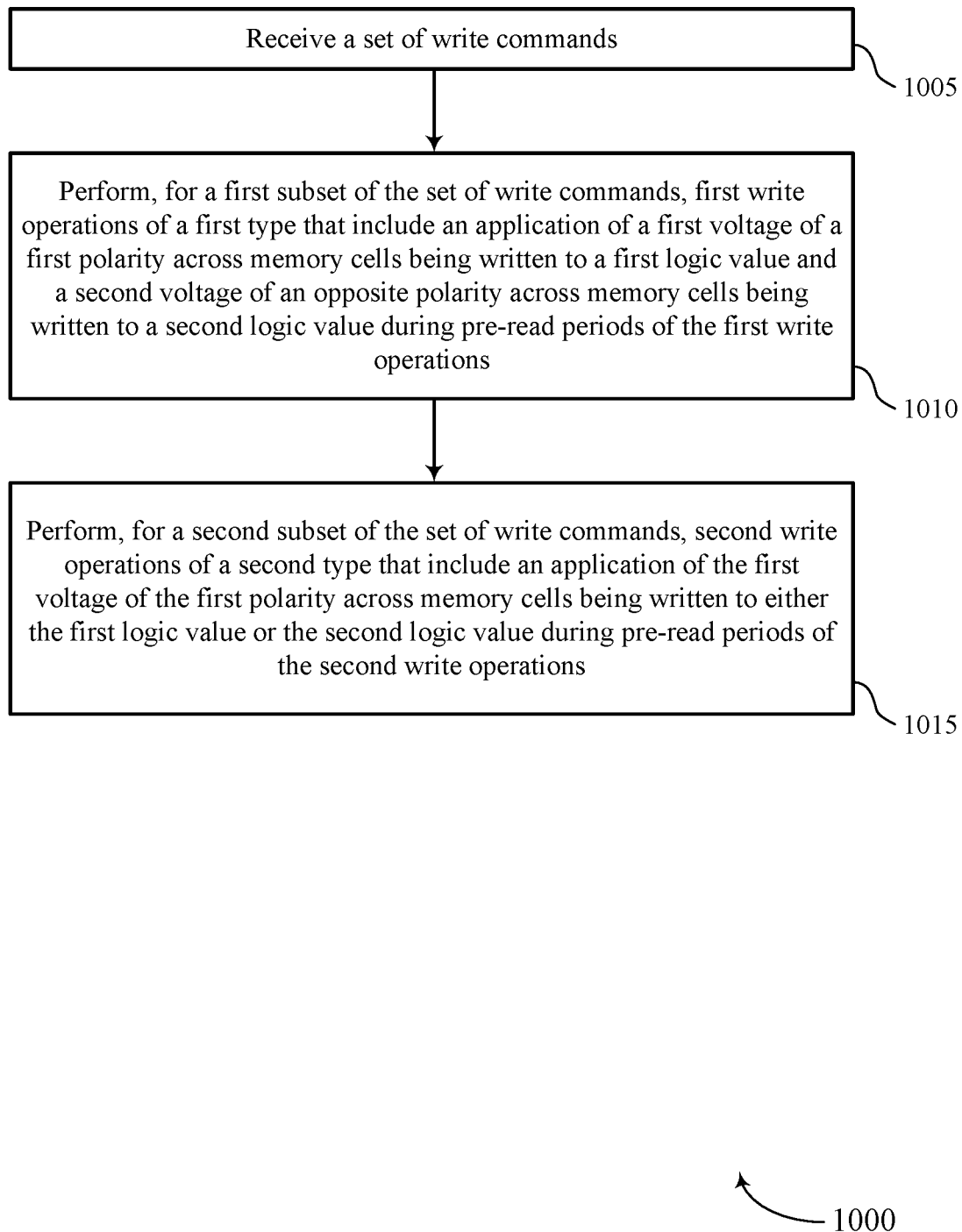

FIG. 10 shows a flowchart illustrating a method or methods 1000 that supports data-based polarity write operations in accordance with aspects of the present disclosure. The operations of method 1000 may be implemented by a memory array or its components as described herein. For example, the operations of method 1000 may be performed by a memory controller as described with reference to FIG. 8. In some examples, a memory array may execute a set of instructions to control the functional elements of the memory array to perform the described functions. Additionally, or alternatively, a memory array may perform aspects of the described functions using special-purpose hardware.

At 1005, the memory array may receive a set of write commands. The operations of 1005 may be performed according to the methods described herein. In some examples, aspects of the operations of 1005 may be performed by a write component as described with reference to FIG. 8.

At 1010, the memory array may perform, for a first subset of the set of write commands, first write operations of a first type that include an application of a first voltage of a first polarity across memory cells being written to a first logic value and a second voltage of an opposite polarity across memory cells being written to a second logic value during pre-read periods of the first write operations. The operations of 1010 may be performed according to the methods described herein. In some examples, aspects of the operations of 1010 may be performed by a write component as described with reference to FIG. 8.

At 1015, the memory array may perform, for a second subset of the set of write commands, second write operations of a second type that include an application of the first voltage of the first polarity across memory cells being written to either the first logic value or the second logic value during pre-read periods of the second write operations. The operations of 1015 may be performed according to the methods described herein. In some examples, aspects of the operations of 1015 may be performed by a write component as described with reference to FIG. 8.

In some examples, an apparatus as described herein may perform a method or methods, such as the method 1000. The apparatus may include features, means, or instructions (e.g., a non-transitory computer-readable medium storing instructions executable by a processor) for receiving a set of write commands, performing, for a first subset of the set of write commands, first write operations of a first type that include an application of a first voltage of a first polarity across memory cells being written to a first logic value and a second voltage of an opposite polarity across memory cells being written to a second logic value during pre-read periods of the first write operations, and performing, for a second subset of the set of write commands, second write operations of a second type that include an application of the first voltage of the first polarity across memory cells being written to either the first logic value or the second logic value during pre-read periods of the second write operations.

Some examples of the method 1000 and the apparatus described herein may further include operations, features, means, or instructions for performing, for a third subset of the set of write commands, third write operations of a third type that include an application of a third voltage of the first polarity across memory cells being written to either the first logic value or the second logic value during pre-read periods of the second write operations throughout the write operation.

In some examples of the method 1000 and the apparatus described herein, receive the set of write commands may include operations, features, means, or instructions for activating the second type of write operation or the third type of write operation based on an amount of drift associated with the set of memory cells.

In some examples of the method 1000 and the apparatus described herein, the second type of write operation may be activated when the amount of drift exceeds a first threshold and the third type of write operation may be activated when the amount of drift exceeds a second threshold that may be larger than the first threshold.

In some examples of the method 1000 and the apparatus described herein, the first polarity may be a negative polarity and the opposite polarity may be a positive polarity.

It should be noted that the methods described herein are possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving a write command associated with a memory cell;
   selecting, from a plurality of types of write operations based at least in part on receiving the write command, a type of write operation to perform for executing the write command based at least in part on an amount of drift associated with the memory cell; and
   performing a write operation in accordance with the type of write operation that is selected.

2. The method of claim 1, further comprising:
   determining that a threshold voltage of the memory cell has drifted in a direction of a polarity by a threshold amount, wherein the type of write operation that is selected comprises applying a voltage of an opposite polarity across the memory cell when written to either a first logic value or a second logic value during a pre-read period of the write operation.

3. The method of claim 2, further comprising:
   determining, after determining that the threshold voltage has drifted by the threshold amount, that the threshold voltage of the memory cell has drifted in the direction by a second threshold amount that is larger than the threshold amount; and
   selecting, from the plurality of types of write operations based at least in part on receiving a second write command associated with the memory cell, a second write operation that comprises applying a second voltage of the polarity across the memory cell when written to the first logic value or a third voltage of the polarity across the memory cell when written to the second logic value, a magnitude of the second voltage and a magnitude of the third voltage being larger than a magnitude of the voltage.

4. The method of claim 2, wherein the polarity is a positive polarity.

5. The method of claim 1, further comprising:
   determining that a threshold voltage of the memory cell is between a first threshold and a second threshold, wherein the type of write operation that is selected comprises applying, during a pre-read period of the write operations, a first voltage of a polarity across the memory cell when written to a first logic value or applying a second voltage of an opposite polarity across the memory cell when written to a second logic value.

6. The method of claim 1, further comprising:
determining the amount of drift associated with the memory cell based at least in part on a duration between access operations performed on the memory cell, a quantity of access operations performed on the memory cell, or both.

7. The method of claim 1, wherein the type of write operation is selected based at least in part on a duration between access operations for the memory cell, a quantity of access operations performed on the memory cell, or both.

8. The method of claim 1, wherein the plurality of types of write operations comprise:
a first type of write operation for applying, during pre-read periods of write operations, a first voltage of a polarity across memory cells being written to a first logic value and a second voltage of an opposite polarity across memory cells being written to a second logic value;
a second type of write operation for applying, during pre-read periods of write operations, the first voltage of the polarity across memory cells being written to either the first logic value or the second logic value; and
a third type of write operation for applying, throughout write operations, a third voltage of the polarity across memory cells being written to the first logic value or a fourth voltage of the opposite polarity across memory cells being written to the second logic value.

9. An apparatus, comprising:
a write operation selector configured to select a type of write operation for executing a received write command from a plurality of types of write operations; and
a polarity write circuit coupled with the write operation selector and configured to perform a first type of write operation associated with an application of a first voltage of a polarity across memory cells being written to a first logic value during a pre-read period of a write operation and an application of a second voltage of an opposite polarity across memory cells being written to a second logic value that is configured to be applied during the pre-read period of the write operation.

10. The apparatus of claim 9, further comprising:
a default write circuit coupled with the write operation selector and configured to perform a second type of write operation associated with an application of the first voltage of the polarity across memory cells being written to either the first logic value or the second logic value that is configured to be applied during pre-read periods of write operations.

11. The apparatus of claim 9, further comprising:
a force write circuit coupled with the write operation selector and configured to perform a third type of write operation associated with an application of a third voltage of the polarity across memory cells being written to the first logic value or a fourth voltage of the opposite polarity across memory cells being written to the second logic value that is configured to be applied throughout the write operation.

12. The apparatus of claim 9, further comprising:
a plurality of drivers coupled with a row line and a plurality of column lines, wherein the row line and a first column line of the plurality of column lines are coupled with a first memory cell and the row line and a second column line of the plurality of column lines are coupled with a second memory cell.

13. The apparatus of claim 12, wherein the polarity write circuit is further configured to:
apply, during a write operation, a first voltage level to the row line;
apply, during the write operation, a second voltage level to the first column line to apply a voltage of the polarity across the first memory cell during the pre-read period of the write operation based at least in part on the write operation being configured to write the first logic value to the first memory cell; and
apply, during the write operation, a third voltage level to the first column line to apply a voltage of the opposite polarity across the second memory cell during the pre-read period of the write operation based at least in part on the write operation being configured to write the second logic value to the second memory cell.

14. The apparatus of claim 12, further comprising:
a default write circuit coupled with the write operation selector and configured to perform a second type of write operation associated with an application of the first voltage of the polarity across memory cells being written to either the first logic value or the second logic value during pre-read periods of write operations, wherein the default write circuit is further configured to:
apply, during a write operation, a first voltage level to the row line; and
apply, during the write operation, a second voltage level to the plurality of column lines to apply a voltage of the opposite polarity across the first memory cell during the pre-read period of the write operation.

15. The apparatus of claim 12, further comprising:
a force write circuit coupled with the write operation selector and configured to perform a third type of write operation associated with an application of a third voltage of the polarity across memory cells being written to the first logic value or a fourth voltage of the opposite polarity across memory cells being written to the second logic value to be applied throughout the write operation, wherein the force write circuit is further configured to:
apply, during a write operation, a first voltage level to the row line; and
apply, throughout the write operation, a second voltage level to the plurality of column lines to apply a voltage of the polarity across the first memory cell.

16. The apparatus of claim 12, wherein:
a first driver of the plurality of drivers is coupled with the row line;
a second driver of the plurality of drivers is coupled with the first column line; and
a third driver of the plurality of drivers is coupled with the second column line.

17. An apparatus, comprising:
a memory device comprising a memory cell; and
a controller coupled with the memory device and configured to cause the apparatus to:
receive a write command associated with the memory cell;
select, from a plurality of types of write operations based at least in part on receiving the write command, a type of write operation to perform for executing the write command based at least in part on an amount of drift associated with the memory cell; and perform a write operation in accordance with the type of write operation that is selected.

18. The apparatus of claim 17, wherein the controller is further configured to cause the apparatus to:
determine that a threshold voltage of the memory cell has drifted in a direction of a polarity by a threshold amount, wherein the type of write operation that is selected comprises applying a voltage of an opposite polarity across the memory cell when written to either a first logic value or a second logic value during a pre-read period of the write operation.

19. The apparatus of claim 17, wherein the controller is further configured to cause the apparatus to:
determine that a threshold voltage of the memory cell is between a first threshold and a second threshold, wherein the type of write operation that is selected comprises applying, during a pre-read period of the write operations, a first voltage of a polarity across the memory cell when written to a first logic value or applying a second voltage of an opposite polarity across the memory cell when written to a second logic value.

20. The apparatus of claim 17, wherein the controller is further configured to cause the apparatus to:
determine the amount of drift associated with the memory cell based at least in part on a duration between access operations performed on the memory cell, a quantity of access operations performed on the memory cell, or both.

* * * * *